(12) United States Patent
Lee et al.

(10) Patent No.: US 9,577,027 B2
(45) Date of Patent: Feb. 21, 2017

(54) SEMICONDUCTOR DEVICE AND PROCESS OF MAKING THE SAME

(71) Applicant: Advanced Semiconductor Engineering, Inc., Kaohsiung (TW)

(72) Inventors: Teck-Chong Lee, Kaohsiung (TW); Chien-Hua Chen, Kaohsiung (TW); Yung-Shun Chang, Kaohsiung (TW); Pao-Nan Lee, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/724,522

(22) Filed: May 28, 2015

(65) Prior Publication Data
US 2015/0349048 A1 Dec. 3, 2015

(30) Foreign Application Priority Data
May 30, 2014 (CN) .......................... 2014 1 0239582

(51) Int. Cl.
| | |
|---|---|
| H01L 27/08 | (2006.01) |
| H01L 49/02 | (2006.01) |
| H01L 27/01 | (2006.01) |
| H01L 21/768 | (2006.01) |
| H01L 21/48 | (2006.01) |
| H05K 1/03 | (2006.01) |
| H05K 1/18 | (2006.01) |
| H01L 23/498 | (2006.01) |

(52) U.S. Cl.
CPC .............. H01L 28/60 (2013.01); H01L 21/486 (2013.01); H01L 21/4857 (2013.01); H01L 21/76898 (2013.01); H01L 23/49822 (2013.01); H01L 27/016 (2013.01); H01L 28/10 (2013.01); H01L 23/49816 (2013.01); H01L 2224/4813 (2013.01); H05K 1/0306 (2013.01); H05K 1/185 (2013.01); H05K 2201/0154 (2013.01)

(58) Field of Classification Search
USPC ....................................................... 257/531
See application file for complete search history.

(56) References Cited

U.S. PATENT DOCUMENTS

| | | |
|---|---|---|
| 6,005,197 A | 12/1999 | Kola et al. |
| 7,446,388 B2 | 11/2008 | Casper et al. |
| 7,936,043 B2 | 5/2011 | Degani et al. |

(Continued)

*Primary Examiner* — Benjamin Sandvik
*Assistant Examiner* — Herve Assouman
(74) *Attorney, Agent, or Firm* — Foley & Lardner LLP; Cliff Z. Liu

(57) ABSTRACT

A semiconductor device includes a substrate, a seed layer, a first patterned metal layer, a dielectric layer and a second metal layer. The seed layer is disposed on a surface of the substrate. The first patterned metal layer is disposed on the seed layer and has a first thickness. The first patterned metal layer includes a first part and a second part. The dielectric layer is disposed on the first part of the first patterned metal layer. The second metal layer is disposed on the dielectric layer and has a second thickness, where the first thickness is greater than the second thickness. The first part of the first patterned metal layer, the dielectric layer and the second metal layer form a capacitor. The first part of the first patterned metal layer is a lower electrode of the capacitor, and the second part of the first patterned metal layer is an inductor.

17 Claims, 33 Drawing Sheets

(56) References Cited

U.S. PATENT DOCUMENTS

| | | | |
|---|---|---|---|
| 2005/0127393 A1* | 6/2005 | Kurokawa | H01L 27/0605 257/103 |
| 2008/0023219 A1* | 1/2008 | Yoshizawa | H01L 27/016 174/260 |
| 2012/0175731 A1* | 7/2012 | Chen | H01L 27/016 257/531 |
| 2012/0235969 A1 | 9/2012 | Burns et al. | |

\* cited by examiner

SEMICONDUCTOR DEVICE AND PROCESS OF MAKING THE SAME

CROSS-REFERENCE TO RELATED PATENT APPLICATIONS

This application claims the benefit of and priority to Chinese Patent Application No. 201410239582.9, filed on May 30, 2014, the content of which is incorporated herein by reference in its entirety.

BACKGROUND

1. Technical Field

The present disclosure relates to a semiconductor device and a process of making the same, and more particularly to a semiconductor device including Integrated Passive Devices (IPDs) and a process of making the same.

2. Description of the Related Art

IPD technology may be used for reducing product size. IPD technology may be used, for example, for an impedance matching circuit, a filter, a coupler, or other components in an electronic device such as a mobile communication device. However, IPD manufacturing time and material cost may be greater than for manufacturing of comparable devices in other technologies, and product price may correspondingly be greater.

SUMMARY

An embodiment of the present disclosure relates to a semiconductor device. The semiconductor device includes a substrate, a seed layer, a first patterned metal layer, a first dielectric layer and a second metal layer. The substrate includes a first surface, and the seed layer is disposed on the first surface. The first patterned metal layer is disposed on the seed layer and has a first thickness. The first patterned metal layer includes a first part and a second part. The first dielectric layer is disposed on the first part of the first patterned metal layer. The second metal layer is disposed on the first dielectric layer and has a second thickness. The first thickness is greater than the second thickness. The first part of the first patterned metal layer, the first dielectric layer and the second metal layer form a capacitor. The first part of the first patterned metal layer is a lower electrode of the capacitor, and the second part of the first patterned metal layer is an inductor.

Another embodiment of the present disclosure relates to a semiconductor device. The semiconductor device includes a substrate, a seed layer, a first patterned metal layer, a first dielectric layer and a second metal layer. The substrate includes a first surface and a second surface opposite the first surface. The substrate defines a plurality of first holes extending through the substrate. The seed layer is disposed on the first surface, and on sidewalls of the first holes, and the seed layer defines a second hole within each of the first holes. The first patterned metal layer is disposed on the seed layer and in the second holes. The first patterned metal layer has a first thickness. The first patterned metal layer includes a first part and a second part. The first dielectric layer is disposed on the first part of the first patterned metal layer. The second metal layer is disposed on the first dielectric layer and has a second thickness, where the first thickness is greater than the second thickness. The first part of the first patterned metal layer, the first dielectric layer and the second metal layer form a capacitor. The first part of the first patterned metal layer is a lower electrode of the capacitor, and the second part of the first patterned metal layer is an inductor.

Another embodiment of the present disclosure relates to a process of making a semiconductor device. The process of making a semiconductor device includes: (a) providing a substrate, where the substrate includes a first surface; (b) providing a seed layer on the first surface of the substrate; (c) forming a first patterned metal layer on the seed layer, where the first patterned metal layer has a first thickness, and the first patterned metal layer includes a first part and a second part; (d) forming a first dielectric layer above the first part of the first patterned metal layer; and (e) forming a second metal layer on the first dielectric layer, the second metal layer having a second thickness, where the first thickness is greater than the second thickness. The first part of the first patterned metal layer, the first dielectric layer and the second metal layer form a capacitor. The first part of the first patterned metal layer is a lower electrode of the capacitor, and the second part of the first patterned metal layer is an inductor.

BRIEF DESCRIPTION OF THE DRAWINGS

FIG. 46A is an enlarged diagram of a seed layer and a first patterned metal layer in FIG. 46.

DETAILED DESCRIPTION

Figure 1:
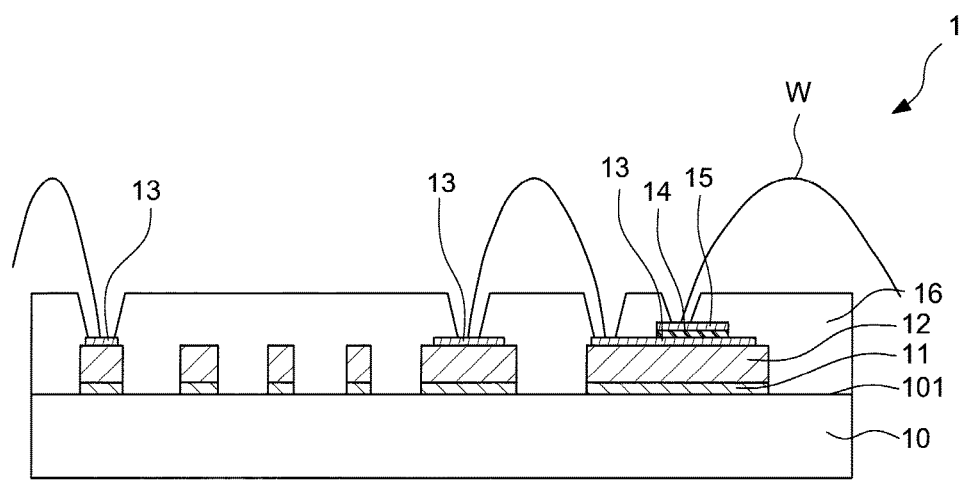
FIG. 1 is a diagram of a semiconductor device according to an embodiment of the present disclosure.

FIG. 1 is a diagram of a semiconductor device according to an embodiment of the present disclosure. As shown in FIG. 1, in an embodiment of the present disclosure, a semiconductor device 1 includes a substrate 10, a seed layer 11, a first patterned metal layer 12, a first dielectric layer 14, a second metal layer 15, a third metal layer 13, a first passivation layer 16 and bonding wires W.

The substrate 10 has a first surface 101. The seed layer 11 is formed on the first surface 101. The first patterned metal layer 12 is formed on the seed layer 11 and has a first thickness. The first patterned metal layer 12 may be a redistribution layer. The first dielectric layer 14 is formed on the first patterned metal layer 12. The second metal layer 15 is formed on the first dielectric layer 14 and has a second thickness. The first thickness may be greater than the second thickness.

The third metal layer 13 is formed on the first patterned metal layer 12. The third metal layer 13 may be formed between the first patterned metal layer 12 and the first dielectric layer 14. The third metal layer 13 has a third thickness. The third thickness may be greater than the second thickness.

The first passivation layer 16 is formed on the first surface 101 of the substrate 10. The first passivation layer 16 covers the seed layer 11, the first patterned metal layer 12, the first dielectric layer 14, the second metal layer 15 and the third metal layer 13. The first passivation layer 16 defines a plurality of openings that expose portions of the second metal layer 15 and portions of the third metal layer 13.

The bonding wires W are connected to exposed portions of the second metal layer 15 and to exposed portions of the third metal layer 13.

Although not shown in FIG. 1, it can be appreciated by those skilled in the art that, in the semiconductor device 1, the first dielectric layer 14 may be directly formed on the first patterned metal layer 12.

The second metal layer 15, the first dielectric layer 14 and the third metal layer 13 may be used to form IPDs. For example, in the illustration of FIG. 1, the second metal layer 15, the first dielectric layer 14 and the third metal layer 13 may form a capacitor structure; and portions of the third metal layer 13 above which the second metal layer 15 and the first dielectric layer 14 are not formed may serve as an inductor structure. That is, for this example, the third metal layer 13 may serve as an inductor and the lower electrode of a capacitor. In the example of the capacitor, a thickness of the third metal layer 13 (lower electrode of the capacitor) is greater than a thickness of the second metal layer 15 (upper electrode of the capacitor), so that electrical properties of the semiconductor device 1 can be enhanced; for example, an insertion loss of the semiconductor device 1 is reduced.

Additionally, the second metal layer 15, the first dielectric layer 14, the third metal layer 13 and the first patterned metal layer 12 may be used to form IPDs. For example, in the illustration of FIG. 1, the second metal layer 15, the first dielectric layer 14, the third metal layer 13 and the first patterned metal layer 12 may form a capacitor structure; and portions of the first patterned metal layer 12 and the third metal layer 13 above which the second metal layer 15 and the first dielectric layer 14 are not formed may serve as an inductor structure. That is, for this example, the third metal layer 13 and the first patterned metal layer 12 may serve as an inductor and the lower electrode of a capacitor. In the example of the capacitor, a combined thickness of the third metal layer 13 and the first patterned metal layer 12 (together, the lower electrode of the capacitor) is greater than a thickness of the second metal layer 15 (upper electrode of the capacitor), so that electrical properties of the semiconductor device 1 can be enhanced; for example, an insertion loss of the semiconductor device 1 is reduced.

Further, the second metal layer 15, the first dielectric layer 14 and the first patterned metal layer 12 may be used to form IPDs. For example, the second metal layer 15, the first dielectric layer 14 and the first patterned metal layer 12 may form a capacitor structure; and portions of the first patterned metal layer 12 above which the second metal layer 15 and the first dielectric layer 14 are not formed may serve as an inductor structure. That is, for this example, the first patterned metal layer 12 may serve as an inductor and the lower electrode of a capacitor. In the example of the capacitor, a thickness of the first patterned metal layer 12 (the lower electrode of the capacitor) is greater than a thickness of the second metal layer 15 (upper electrode of the capacitor), so that electrical properties of the semiconductor device 1 can be enhanced; for example, an insertion loss of the semiconductor device 1 may be reduced.

In the examples in which portions of the first patterned metal layer 12 (or a combination of the first patterned metal layer 12 and the third metal layer 13) form an inductor and a lower electrode of a capacitor, the first patterned metal layer 12 is formed on the seed layer 11, so that the semiconductor device 1 has a relatively smaller size than a semiconductor device including a capacitor and an inductor on different levels or different layers.

As can be seen from FIG. 1 and the discussions above, integrating portions of multiple passive devices (such as both an inductor and a lower electrode of a capacitor) in the first patterned metal layer 12 (or a combination of the first patterned metal layer 12 and the third metal layer 13) may simplify the manufacturing process of the semiconductor device 1. Further, connecting paths between passive devices (such as a capacitor and an inductor) may be shortened, and a contact area of the passive devices may be increased.

Figure 2:
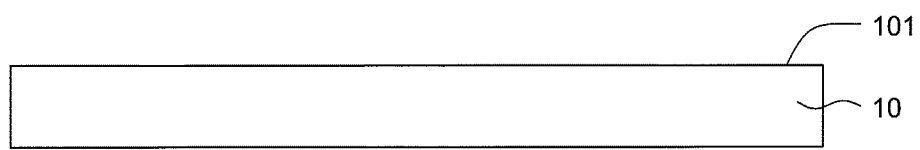
FIGS. 2, 3, 4, 5, 6, 7, 8, 9, 10, 11, 12, 13, 14, 15, 16, 17 and 18 are diagrams of a process of making a semiconductor device according to an embodiment of the present disclosure.

FIGS. 2-18 are diagrams of a process of making a semiconductor device according to an embodiment of the present disclosure. Referring to FIG. 2, a substrate 10 is provided, the substrate 10 including a first surface 101. The substrate 10 may be, or may include, but is not limited to, glass, silicon or silicon dioxide. The substrate 10 may have a thickness from about 50 µm to about 700 µm, such as about 50 µm to about 100 µm, about 50 µm to about 200 µm, about 50 µm to about 300 µm, about 50 µm to about 400 µm, about 50 µm to about 500 µm, or about 50 m to about 600 µm.

Figure 3:
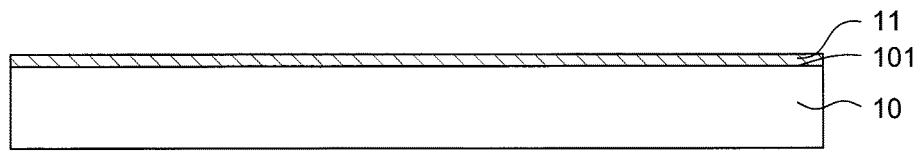

Referring to FIG. 3, a seed layer 11 is formed on the first surface 101 of the substrate 10. The seed layer 11 may be coated on the first surface 101 of the substrate 10 by using a sputter deposition process or physical vapor deposition (PVD) technique. In another embodiment, the seed layer 11 may be coated on the first surface 101 of the substrate 10 by using a chemical vapor deposition (CVD) technique, an atomic layer deposition (ALD) technique or an evaporation technique. The seed layer 11 may be, or may include, but is not limited to, titanium or copper or an alloy thereof. The seed layer 11 may have a thickness from about 1800 Angstrom (Å) to about 2200 Å, such as about 1800 Å to about 1900 Å, about 1800 Å to about 2000 Å, or about 1800 Å to about 2100 Å.

Figure 4:
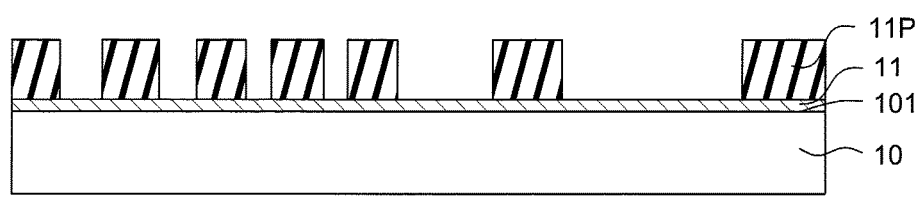

Referring to FIG. 4, a mask 11P is formed on the seed layer 11. The mask 11P may be formed on the seed layer 11 by using a photo-lithography technique, or other technique. A photo-lithography technique includes, for example, lamination, exposure and development. The mask 11P may be, or may include, but is not limited to, a photoresist (PR) layer or a dry-resist film. The mask 11P may be formed on the seed layer 11 to cover part of the seed layer 11, and may be formed by, for example, pressing or laminating.

Figure 5:
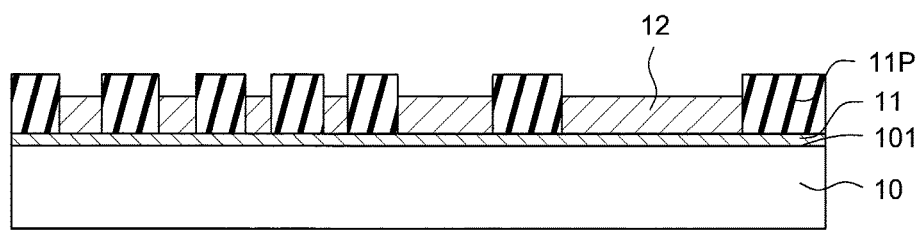

Referring to FIG. 5, a first patterned metal layer 12 is formed on the seed layer 11 using the mask 11P. The first patterned metal layer 12 may be formed on the seed layer 11 by an electroplating technique or other technique. The first patterned metal layer 12 may be, or may include, but is not limited to, copper. The first patterned metal layer 12 may have a first thickness from about 9 μm to about 11 μm, such as about 9 μm to about 10 μm.

Figure 6:
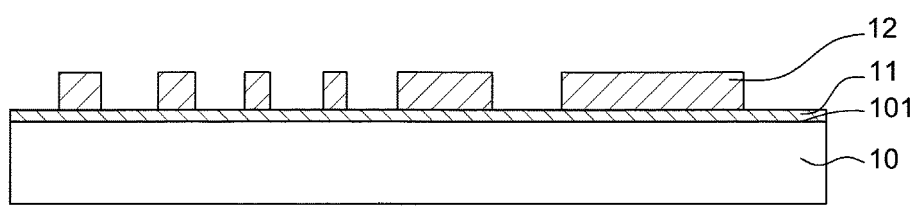

Referring to FIG. 6, the mask 11P in FIG. 5 is removed, such as by a stripping technique or other technique.

Figure 7:
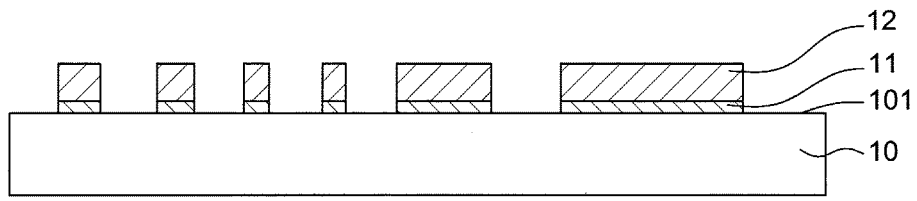

Referring to FIG. 7, a portion of the seed layer 11 not covered by the first patterned metal layer 12 is removed; for example, by an etching technique such as wet etching, or by another technique. A first thickness of the first patterned metal layer 12 is greater than a thickness of the seed layer 11, therefore, the first patterned metal layer 12 may be used as a mask to etch the seed layer 11 without using a photo-lithography or other masking technique, thereby reducing manufacturing time and avoiding material and manufacturing costs for forming a mask. A surface of the first patterned metal layer 12 may also be affected by etching, thus the surface of the first patterned metal layer 12 may be relatively rough (e.g., have a relatively greater surface roughness (Ra)) following etching. For example, following etching, a surface of the first patterned metal layer 12 in FIG. 7 may have a surface roughness of about 0.1 μm to about 0.5 μm, such as about 0.1 μm to about 0.2 μm, about 0.1 μm to about 0.3 μm, or about 0.1 μm to about 0.4 μm.

Figure 8:
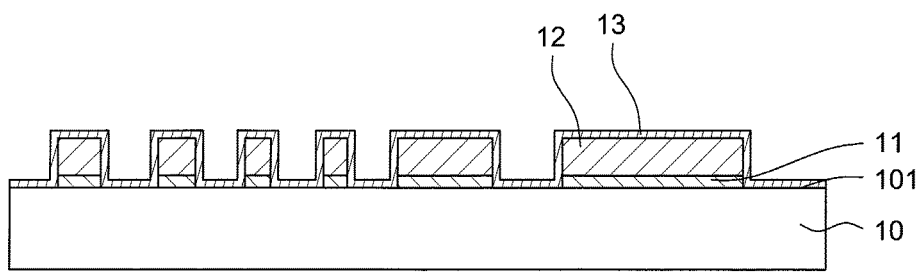

Referring to FIG. 8, a third metal layer 13 is formed on the first surface 101 of the substrate 10 and on the first patterned metal layer 12. The third metal layer 13 may be formed, for example, by a sputter deposition process or other technique. The third metal layer 13 may be, or may include, but is not limited to, aluminum or copper or an alloy thereof, or other metal or alloy. The third metal layer 13 may have a thickness from about 1 μm to about 16 μm, such as about 1 μm to about 8 μm, about 1 μm to about 10 μm, about 1 μm to about 12 μm, or about 1 μm to about 14 μm.

Figure 9:
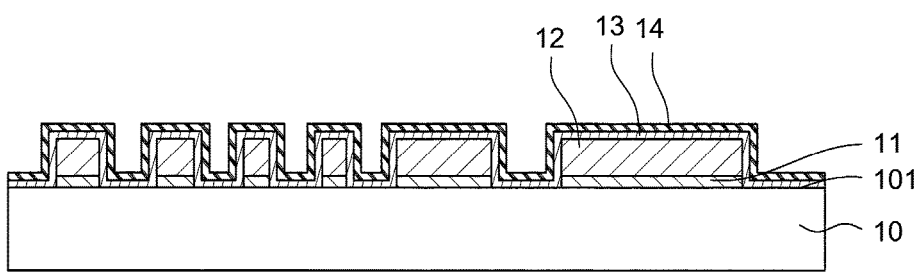

Referring to FIG. 9, a first dielectric layer 14 is formed on the third metal layer 13. The first dielectric layer 14 may be formed, for example, by a sputter deposition process or other technique. In some embodiments, the first dielectric layer 14 is formed by forming a thin layer of a material on the third metal layer 13. The thin layer material may be, or may include, but is not limited to, tantalum (Ta). For the example of Ta, the thin layer is oxidized to $Ta_2O_5$ using an anodic oxidation technique so as to form the first dielectric layer 14 containing $Ta_2O_5$. The first dielectric layer 14 may have a thickness from about 300 Å to about 4900 Å, such as about 300 Å to about 1000 Å, about 300 Å to about 2000 Å, about 300 Å to about 3000 Å, about 300 Å to about 4000 Å, or about 300 Å to about 4500 Å.

Figure 10:
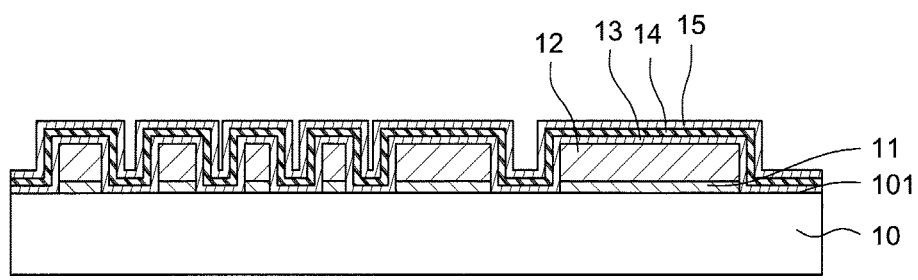

Referring to FIG. 10, a second metal layer 15 is formed on the first dielectric layer 14. The second metal layer 15 may be formed on the first dielectric layer 14, for example, by a sputter deposition process or other technique. The second metal layer 15 may be, or may include, but is not limited to, aluminum or copper or an alloy thereof, or other metal or alloy. The second metal layer 15 may have a thickness from about 0.25 μm to about 1.1 μm, such as about 0.25 μm to about 0.5 μm, about 0.25 μm to about 0.7 μm, or about 0.25 μm to about 0.9 μm.

Figure 11:
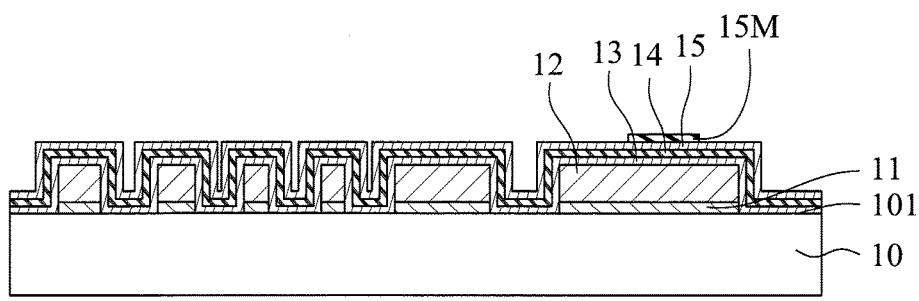

Referring to FIG. 11, a mask 15M is formed on the second metal layer 15. The mask 15M may be formed, for example, by a photo-lithography technique or other technique. A photo-lithography technique includes lamination, exposure and development. The mask 15M may be, or may include, but is not limited to, a photoresist layer or a dry-resist film. The mask 15M may be formed on the second metal layer 15 to cover part of the second metal layer 15; for example, the mask 15M may be formed in a pressing or laminating manner.

Figure 12:
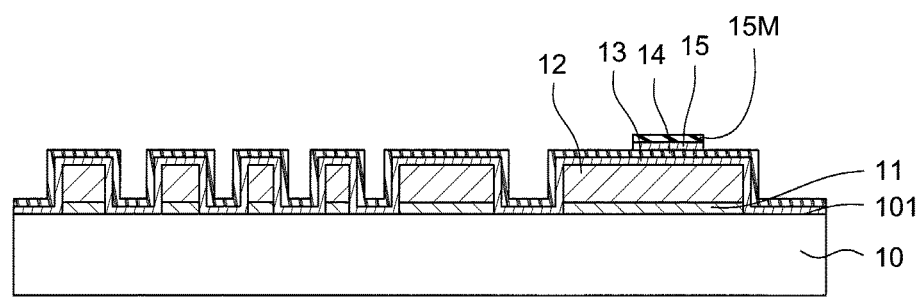

Referring to FIG. 12, part of the second metal layer 15 is removed; for example, by an etching technique.

Figure 13:
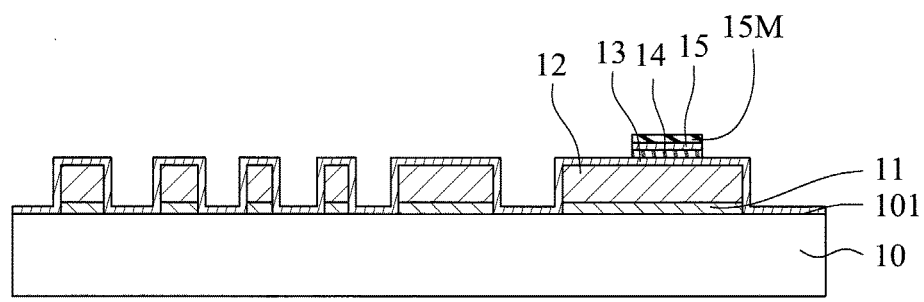

Referring to FIG. 13, part of the first dielectric layer 14 may be removed; for example by way of the mask 15M.

Figure 14:
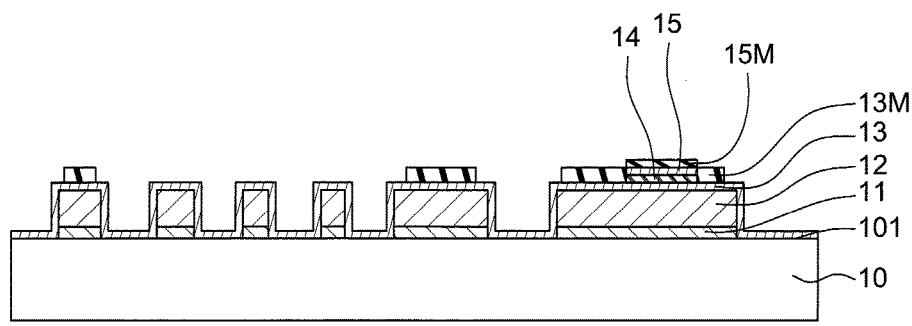

Referring to FIG. 14, a mask 13M is formed on a portion of the third metal layer 13. The manner in which the mask 13M is formed and composition thereof are similar to the manner in which the mask 15M in FIG. 11 is formed and composition thereof.

Figure 15:
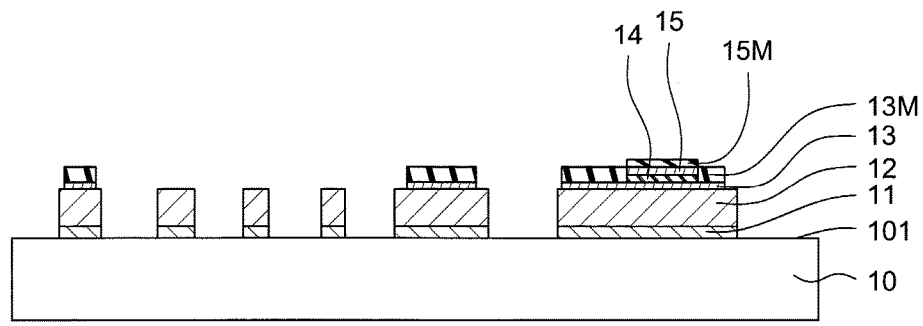

Referring to FIG. 15, a portion of the third metal layer 13 not covered by the masks 13M and 15M may be partially removed; for example by an etching technique using the masks 13M and 15M, or by another technique. An area of the third metal layer 13 may be, but is not necessarily, equal to or greater than an area of the second metal layer 15. Further, an area of the first patterned metal layer 12 is greater than or equal to an area of the third metal layer 13.

Figure 16:
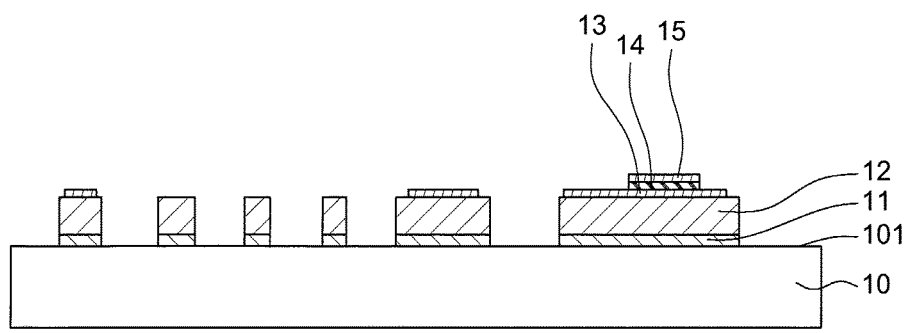

Referring to FIG. 16, the masks 13M and 15M are removed; for example, by a stripping technique.

Figure 17:
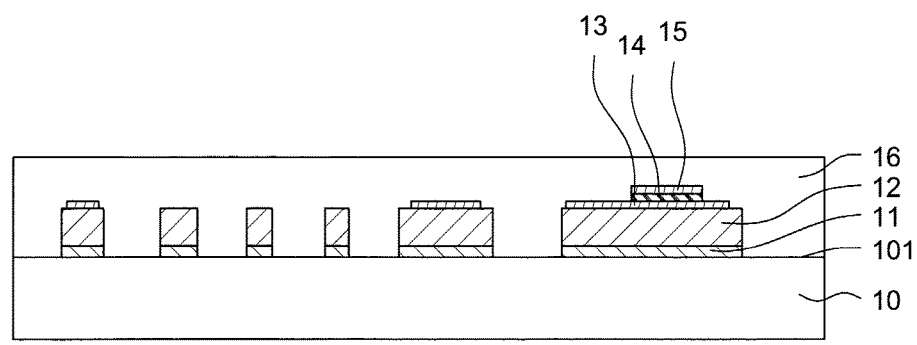

Referring to FIG. 17, a first passivation layer 16 is formed on the first surface 101 of the substrate 10. The first passivation layer 16 covers the seed layer 11, the first patterned metal layer 12, the first dielectric layer 14, the second metal layer 15 and the third metal layer 13. The first passivation layer 16 may be, or may include, but is not limited to, polyimide, TMMR S2000 photodefinable dielectric material from Tokyo Ohka Kogyo Co. Ltd. (TMMR), or Benzocyclobutene (BCB).

Figure 18:
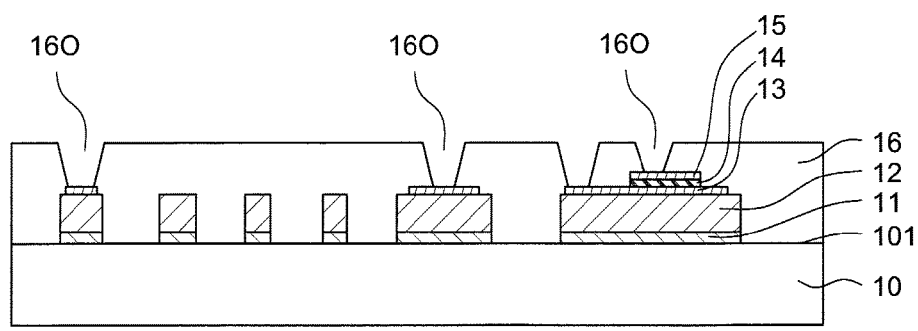

Referring to FIG. 18, openings 16O are formed on the first passivation layer 16 through, but not limited to, laser, sandblasting and/or etching to expose the second metal layer 15 and the third metal layer 13. The bonding wire W may be connected to the exposed second metal layer 15 and third metal layer 13 by using a wire bond technique to form the semiconductor device 1 in FIG. 1.

Although not shown in FIGS. 1-18, it can be appreciated by those skilled in the art that, in another embodiment of the present disclosure, the first dielectric layer 14 may be directly formed on the first patterned metal layer 12; in other words, the third metal layer 13 may be omitted, and the related steps of forming and removing the third metal layer 13 are correspondingly omitted. In some embodiments, with respect to FIG. 5, the first patterned metal layer 12 may be formed, whose thickness is equal to the sum of the thicknesses of what otherwise would have been the first patterned metal layer 12 and the third metal layer 13. In other embodiments, the thickness of the first patterned metal layer 12 is not increased when the third metal layer 13 is omitted.

Figure 19:
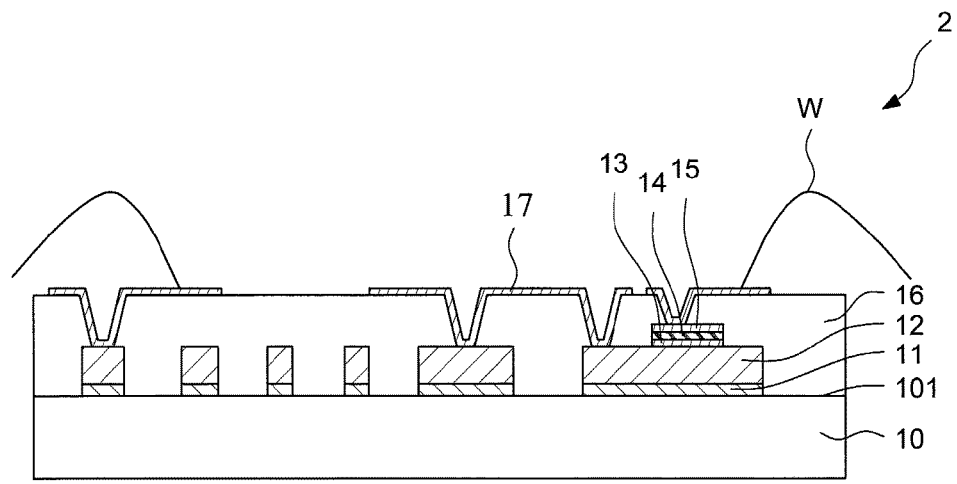
FIG. 19 is a diagram of a semiconductor device according to another embodiment of the present disclosure.

FIG. 19 is a diagram of a semiconductor device according to another embodiment of the present disclosure. Referring to FIG. 19, a semiconductor device 2 includes a substrate 10, a seed layer 11, a first patterned metal layer 12, a first dielectric layer 14, a second metal layer 15, a third metal layer 13, a first passivation layer 16, a fourth metal layer 17 and bonding wires W.

The structure of the semiconductor device 2 is similar to that of the semiconductor device 1, and one difference thereof lies in that, in the semiconductor device 2, portions of the third metal layer 13 are omitted, and the fourth metal layer 17 is formed on the first passivation layer 16 and in the openings thereof, and the bonding wires W are connected to the fourth metal layer 17. Another difference between the semiconductor device 2 and the semiconductor device 1 lies in that an area of the second metal layer 15 is substantially the same as an area of the third metal layer 13.

Figure 20:
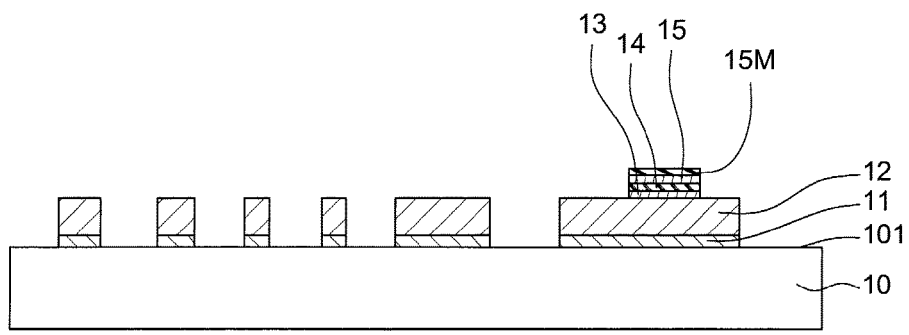
FIGS. 20, 21, 22, 23 and 24 are diagrams of a process of making a semiconductor device according to another embodiment of the present disclosure.

FIGS. 20-24 are diagrams of a process of making a semiconductor device according to another embodiment of the present disclosure. In FIG. 20, a device similar to the device illustrated in FIG. 13 is provided, and, referring to FIG. 20, part of the third metal layer 13 not covered by the mask 15M is removed; for example, by an etching technique or other technique.

Figure 21:
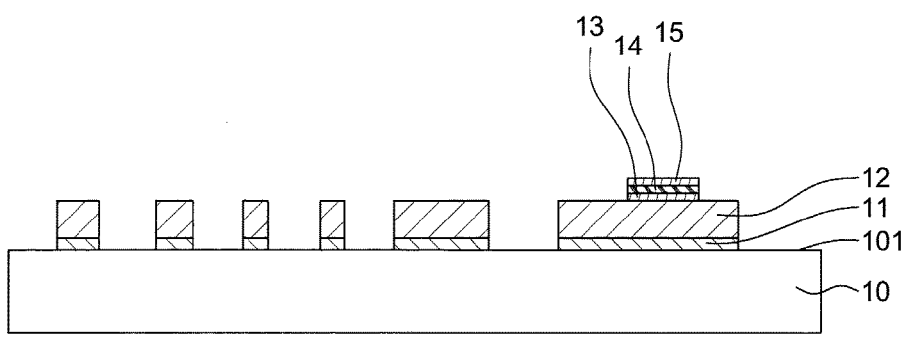

Referring to FIG. 21, the mask 15M is removed; for example, by a stripping technique or other technique.

Figure 22:
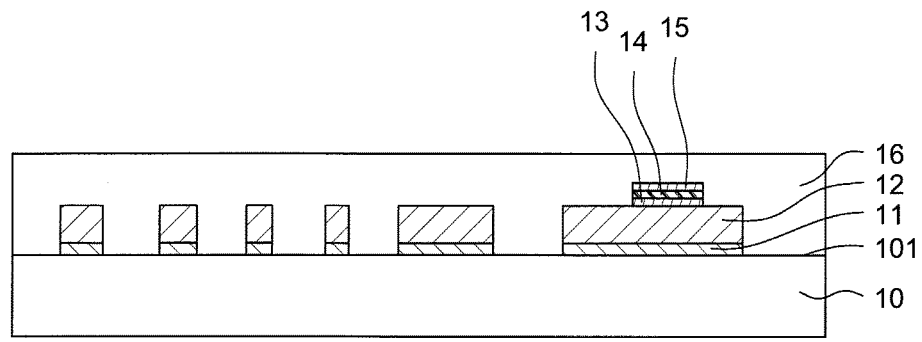

Referring to FIG. 22, a first passivation layer 16 is formed on the first surface 101 of the substrate 10. The first passivation layer 16 covers the seed layer 11, the first patterned metal layer 12, the third metal layer 13, the first dielectric layer 14 and the second metal layer 15. The first passivation layer 16 may be, or may include, but is not limited to, polyimide, TMMR or BCB.

Figure 23:
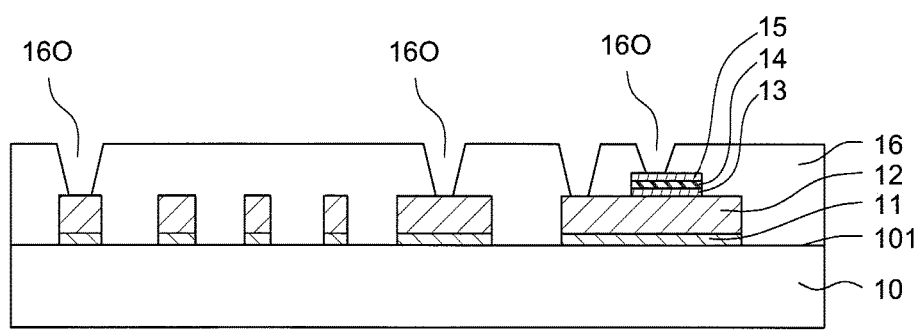

Referring to FIG. 23, openings 16O are formed in the first passivation layer 16 to expose portions of the second metal layer 15 and the first patterned metal layer 12; for example, by the use of a laser, sandblasting and/or etching technique, or other technique.

Figure 24:
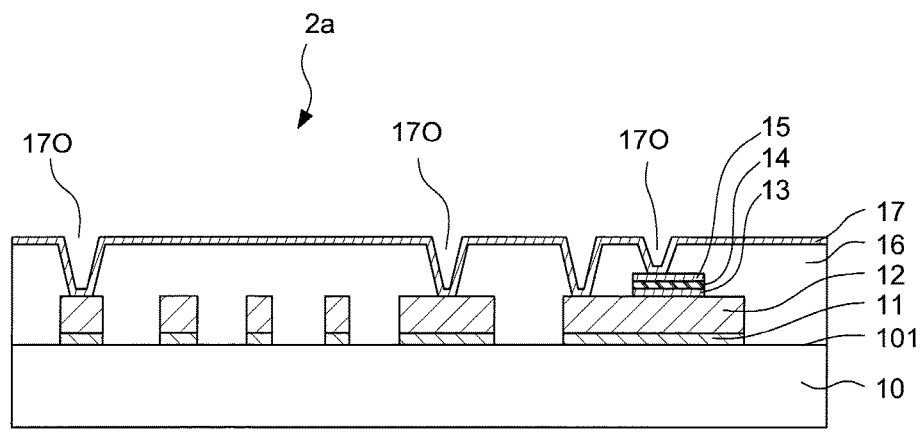

Referring to FIG. 24, a fourth metal layer 17 is formed, to form semiconductor device 2a. The fourth metal layer 17 is formed on the first passivation layer 16, and also on portions the first patterned metal layer 12 and the second metal layer 15 that are exposed by openings 16O of the first passivation layer 16. The fourth metal layer 17 may be formed, for example, by a sputter deposition process or other technique. The fourth metal layer 17 may be, or may include, but is not limited to, aluminum or copper or an alloy thereof, or other metal or alloy. The fourth metal layer 17 may have a thickness from about 0.5 µm to about 3 µm, such as about 0.5 µm to about 1 µm, about 0.5 µm to about 1.5 µm, about 0.5 µm to about 2 µm, or about 0.5 µm to about 2.5 µm. In an embodiment, the fourth metal layer 17 is a seed layer, which may be, or may include, but is not limited to, titanium or copper or an alloy thereof, or other metal or alloy. The fourth metal layer 17, when formed as a seed layer, may have a thickness from about 1800 Å to about 2200 Å, such as about 1800 Å to about 1900 Å, about 1800 Å to about 2000 Å, or about 1800 Å to about 2100 Å.

In FIG. 24, the fourth metal layer 17 may be patterned by a photo-lithography technique or other technique. A photo-lithography technique includes lamination, exposure and development. Bonding wires W may be connected to the (patterned) fourth metal layer 17 using a wire bond technique, to form the semiconductor device 2 in FIG. 19.

Although not shown in FIGS. 19-24, it can be appreciated by those skilled in the art that, in another embodiment of the present disclosure, the first dielectric layer 14 may be directly formed on the first patterned metal layer 12; in other words, the third metal layer 13 may be omitted, and the related steps of forming and removing the third metal layer 13 may be correspondingly omitted.

Figure 25:
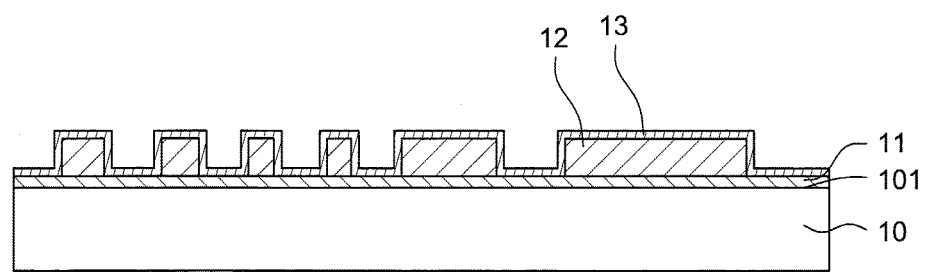
FIGS. 25, 26, 27, 28, 29, 30 and 31 are diagrams of a process of making a semiconductor device according to another embodiment of the present disclosure.

FIGS. 25-31 are diagrams of a process of making a semiconductor device according to another embodiment of the present disclosure. In FIG. 25, a device similar to the device illustrated in FIG. 6 is provided, and, referring to FIG. 25, a third metal layer 13 is formed on the seed layer 11 and the first patterned metal layer 12. The third metal layer 13 may be formed, for example, using a sputter deposition process or other technique. The third metal layer 13 may be, or may include, but is not limited to, aluminum or copper or an alloy thereof, or other metal or alloy. The third metal layer 13 may have a thickness from about 1 µm to about 16 µm, such as 1 µm to about 8 µm, 1 µm to about 10 µm, 1 µm to about 12 µm, or 1 µm to about 14 µm.

Figure 26:
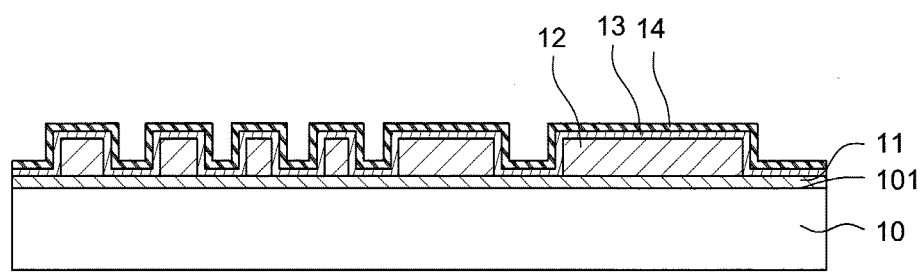

Referring to FIG. 26, a first dielectric layer 14 is formed on the third metal layer 13. The first dielectric layer 14 may be formed, for example, using a sputter deposition process or other technique. In some embodiments, the first dielectric layer 14 is formed by forming a thin layer of a material on the third metal layer 13. The thin layer material may be, or may include, but is not limited to, Ta. For the example of Ta, the thin layer is oxidized to $Ta_2O_5$ using an anodic oxidation technique so as to form the first dielectric layer 14 containing $Ta_2O_5$. The first dielectric layer 14 may have a thickness from about 300 Å to about 4900 Å, such as about 300 Å to about 1000 Å, about 300 Å to about 2000 Å, about 300 Å to about 3000 Å, about 300 Å to about 4000 Å, or about 300 Å to about 4500 Å.

Figure 27:
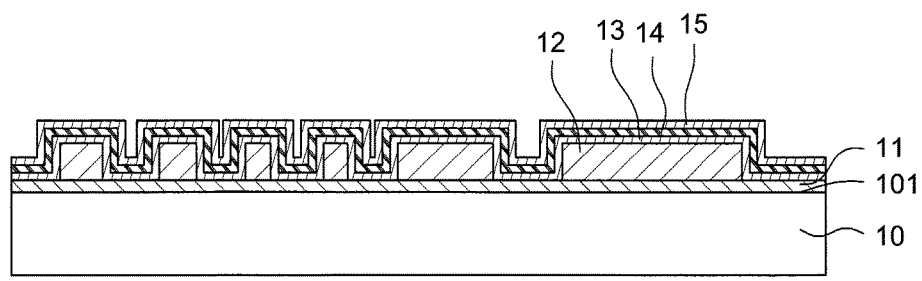

Referring to FIG. 27, a second metal layer 15 is formed on the first dielectric layer 14. The second metal layer 15 may be formed, for example, using a sputter deposition process or other technique. The second metal layer 15 may be, or may include, but is not limited to, aluminum or copper or an alloy thereof, or other metal or alloy. The second metal layer 15 may have a thickness from about 0.25 µm to about 1.1 µm, such as about 0.25 µm to about 0.5 µm, about 0.25 µm to about 0.7 µm, or about 0.25 µm to about 0.9 µm.

Figure 28:
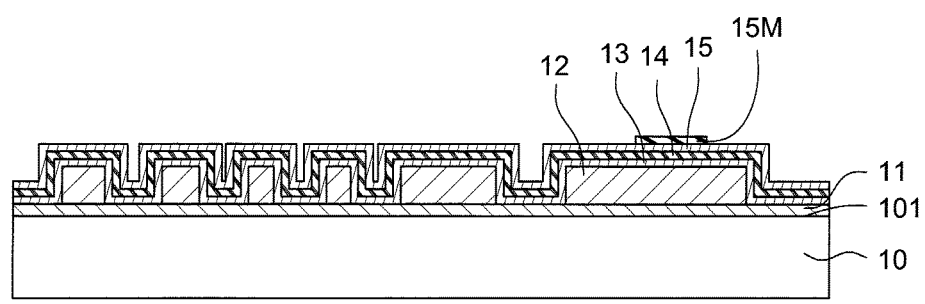

Referring to FIG. 28, a mask 15M is formed on the second metal layer 15. The mask 15M may be formed, for example, by a photo-lithography technique or other technique. A photo-lithography technique includes lamination, exposure and development. The mask 15M may be, or may include, but is not limited to, a photoresist layer or a dry-resist film. The mask 15M may be formed on the second metal layer 15 to cover part of the second metal layer 15; for example, the mask 15M may be formed in a pressing or laminating manner.

Figure 29:
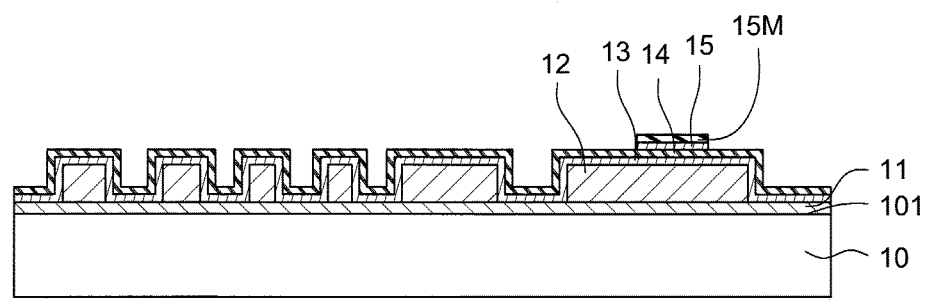

Referring to FIG. 29, a portion of the second metal layer 15 is removed; for example, by etching, such as by using mask 15M.

Figure 30:
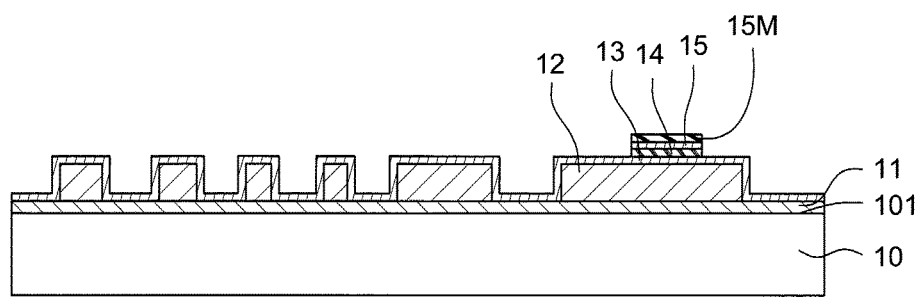

Referring to FIG. 30, a portion of the first dielectric layer 14 is removed; for example, by etching, such as by using mask 15M.

Figure 31:
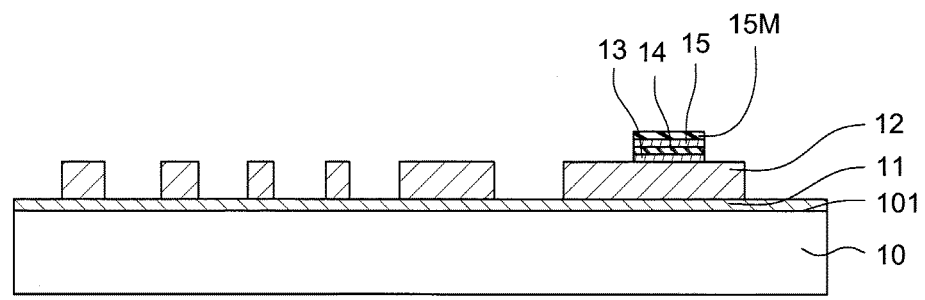

Referring to FIG. 31, a portion of the third metal layer 13 is removed; for example, by etching, such as by using mask 15M. Subsequently, the mask 15M is removed, for example, using a stripping technique, to form the structure shown in FIG. 21 (and the semiconductor device 2 in FIG. 19 is formed according to the process shown in FIGS. 22-24).

Although not shown in FIGS. 25-31, it can be appreciated by those skilled in the art that, in another embodiment of the present disclosure, the first dielectric layer 14 may be directly formed on the first patterned metal layer 12. In other words, the third metal layer 13 may be omitted, and the related steps of forming and removing the third metal layer 13 correspondingly may be omitted.

Figure 32:
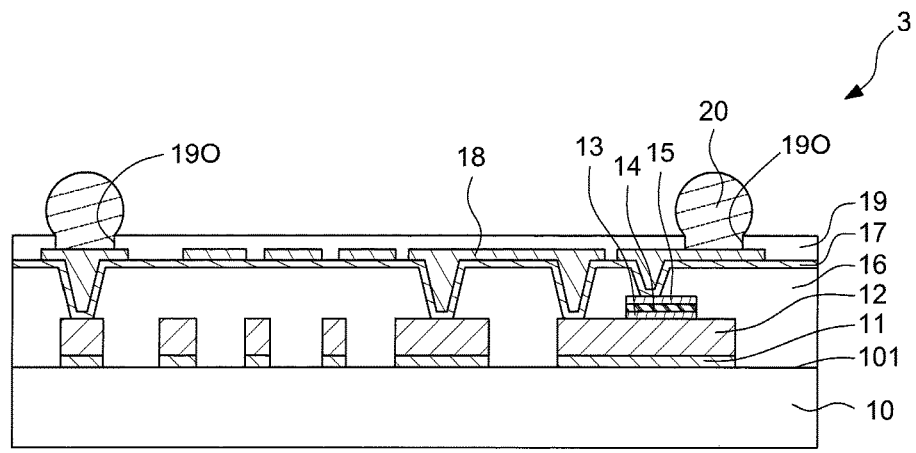
FIG. 32 is a diagram of a semiconductor device according to another embodiment of the present disclosure.

FIG. 32 is a diagram of a semiconductor device according to another embodiment of the present disclosure. Referring to FIG. 32, the semiconductor device 3 includes a substrate 10, a seed layer 11, a first patterned metal layer 12, a first dielectric layer 14, a second metal layer 15, a third metal layer 13, a first passivation layer 16, a fourth metal layer 17 formed as a seed layer, a fifth patterned metal layer 18, a second passivation layer 19 and an electrical connection component 20.

The structure of the semiconductor device 3 is similar to that of the semiconductor device 2a in FIG. 24, and one difference thereof lies in that, in the semiconductor device 3, the fifth patterned metal layer 18 is formed on the fourth metal layer 17 (seed layer), and part of the fifth patterned metal layer 18 is formed in openings 17O. Another difference between the semiconductor device 3 and the semiconductor device 2a lies in that, in the semiconductor device 3, the second passivation layer 19 covers the fourth metal layer 17 and the fifth patterned metal layer 18, and defines openings 19O, and the electrical connection component 20 is formed in the openings 19O. The fifth patterned metal layer 18 may be a redistribution layer.

Figure 33:
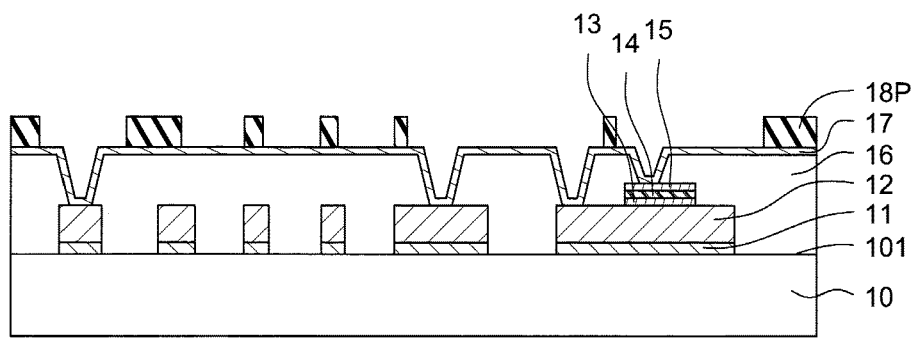
FIGS. 33, 34, 35, 36, 37, 38 and 39 are diagrams of a process of making a semiconductor device according to another embodiment of the present disclosure.

FIGS. 33-39 are diagrams of a process of making a semiconductor device according to another embodiment of the present disclosure. Referring to FIG. 33, a device similar to the device shown in FIG. 24 is provided. A mask 18P is formed on the fourth metal layer 17. The mask 18P may be formed, for example, by a photo-lithography technique or other technique. A photo-lithography technique includes lamination, exposure and development. The mask 18P may be, or may include, but is not limited to, a photoresist layer or a dry-resist film. The mask 18P may be formed on the fourth metal layer 17 to cover part of the fourth metal layer 17; for example, by pressing or laminating.

Figure 34:
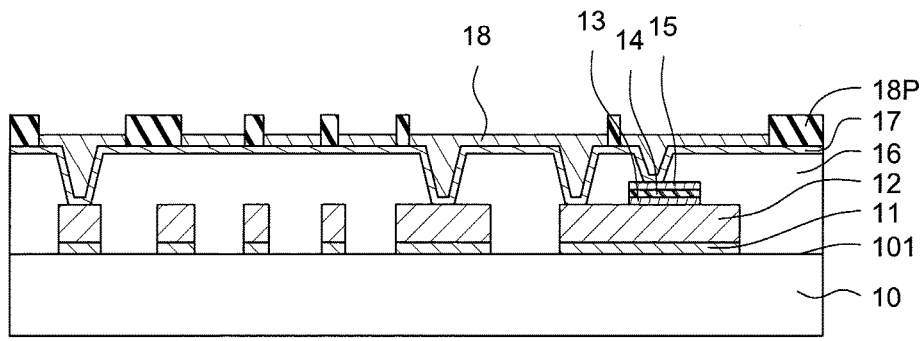

Referring to FIG. 34, a fifth patterned metal layer 18 is formed on the fourth metal layer 17 using the mask 18P. The fifth patterned metal layer 18 may be formed, for example, by an electroplating technique or other technique. The fifth patterned metal layer 18 may be, or may include, but is not limited to, copper or other metal, or metal alloy. The fifth patterned metal layer 18 may have a thickness from about 3 µm to about 15 µm, such as about 3 µm to about 7 µm, about 3 µm to about 9 µm, about 3 µm to about 11 µm, or about 3 µm to about 13 µm.

Figure 35:
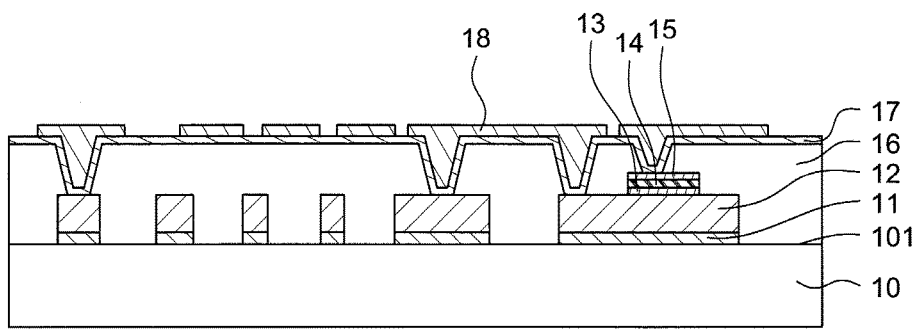

Referring to FIG. 35, the mask 18P is removed; for example, by a stripping technique or other technique.

Figure 36:
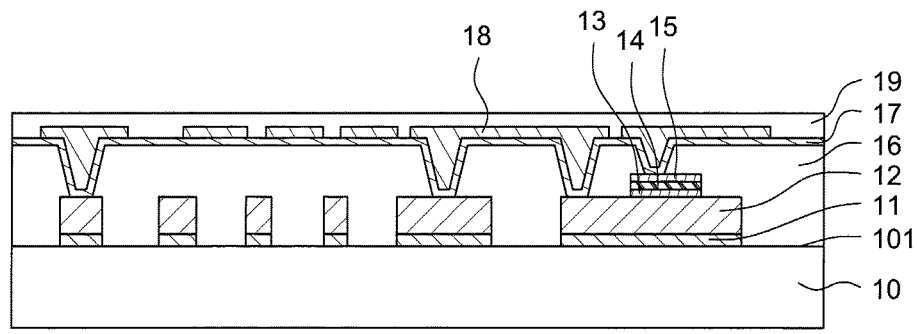

Referring to FIG. 36, a second passivation layer 19 is formed on the fourth metal layer 17 and the fifth patterned metal layer 18, and the second passivation layer 19 covers the fourth metal layer 17 and the fifth patterned metal layer 18. The second passivation layer 19 may be, or may include, but is not limited to, polyimide, TMMR or BCB.

Figure 37:
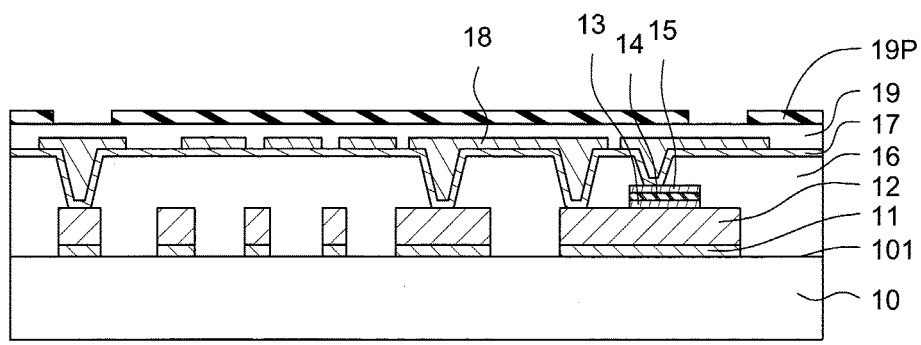

Referring to FIG. 37, a mask 19P is formed on the second passivation layer 19. The mask 19P may be formed, for example, by a photo-lithography technique or other technique. A photo-lithography technique includes lamination, exposure and development. The mask 19P may be, or may include, but is not limited to, a photoresist layer or a dry-resist film. The mask 19P may be formed, for example, in a pressing or laminating manner.

Figure 38:
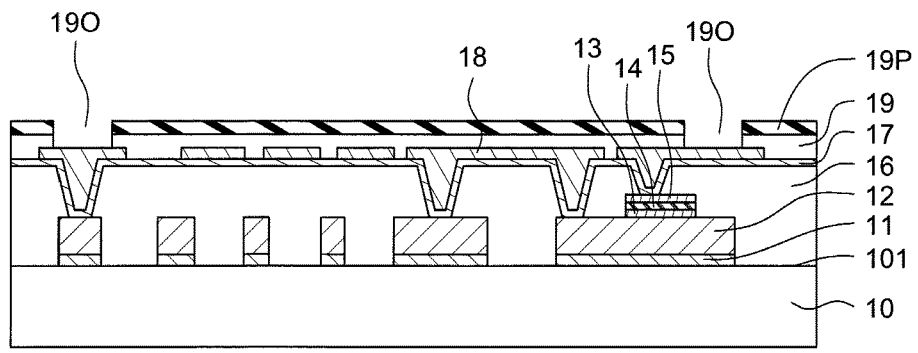

Referring to FIG. 38, openings 19O are formed in the second passivation layer 19 not covered by the mask 19P, to expose part of the fifth patterned metal layer 18; for example, openings 19O may be formed by a laser, sand-blasting and/or etching technique, or other technique.

Figure 39:
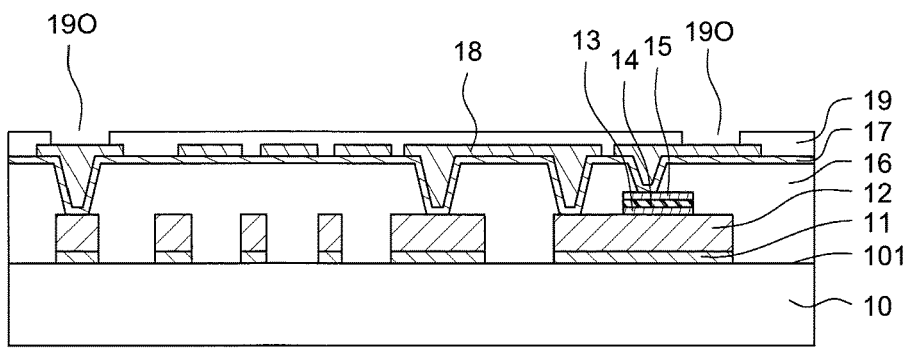

Referring to FIG. 39, the mask 19P is removed; for example, by a stripping technique. Electrical connection components 20 (e.g., solder balls) may be formed in the openings 19O of the second passivation layer 19 to form the semiconductor device 3 in FIG. 32. The electrical connection components 20 may be implanted by, for example, a solder ball implantation technique. The electrical connection component 20 is electrically connected to the fifth patterned metal layer 18 to form the semiconductor device 3 shown in FIG. 32 or a Wafer Level Chip Scale Package including semiconductor device 3.

Although not shown in FIGS. 32-39, it can be appreciated by those skilled in the art that, in another embodiment of the present disclosure, the first dielectric layer 14 may be directly formed on the first patterned metal layer 12. In other words, the third metal layer 13 may be omitted, and the related steps of forming and removing the third metal layer 13 may be correspondingly omitted.

Figure 40A:
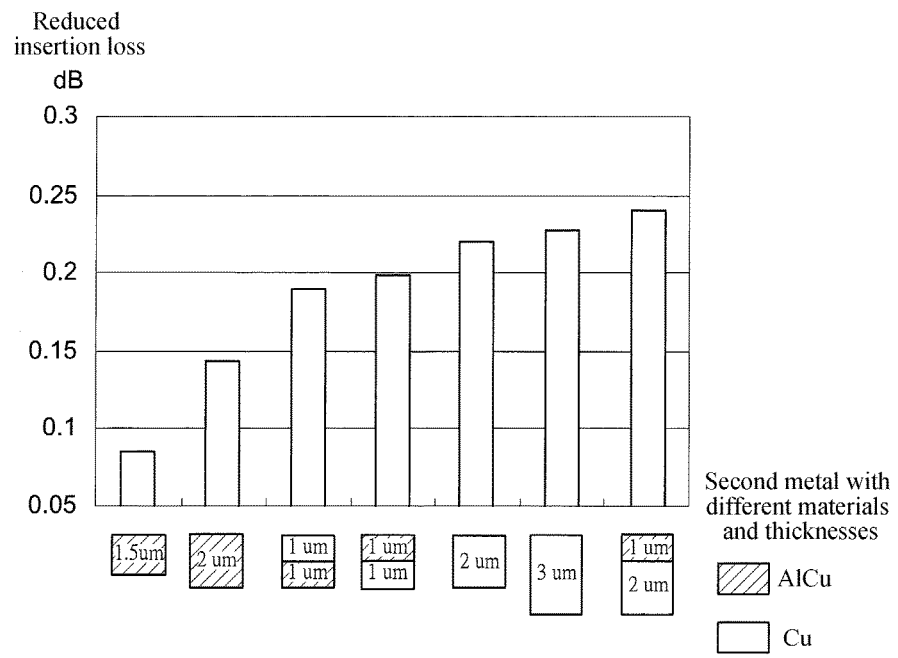
FIG. 40A illustrates a reduced insertion loss of a semiconductor device in an embodiment of the present disclosure.

FIG. 40A illustrates values of insertion loss decrease of a semiconductor device (e.g., semiconductor device 1, 2, 2a or 3) according to the present disclosure, in an embodiment in which the semiconductor device includes a third metal layer 13. Values of insertion loss are shown for different materials and thicknesses of the third metal layer 13, for operation of the semiconductor device at a frequency of 2.7 gigahertz (GHz). For example, for the third metal layer 13 with a 1 µm thick aluminum copper (AlCu) layer and a 2 µm thick copper layer, the semiconductor device has a relatively small insertion loss at an operating frequency of 2.7 GHz: the insertion loss is decreased by 0.23 dB-0.25 dB.

Figure 40B:
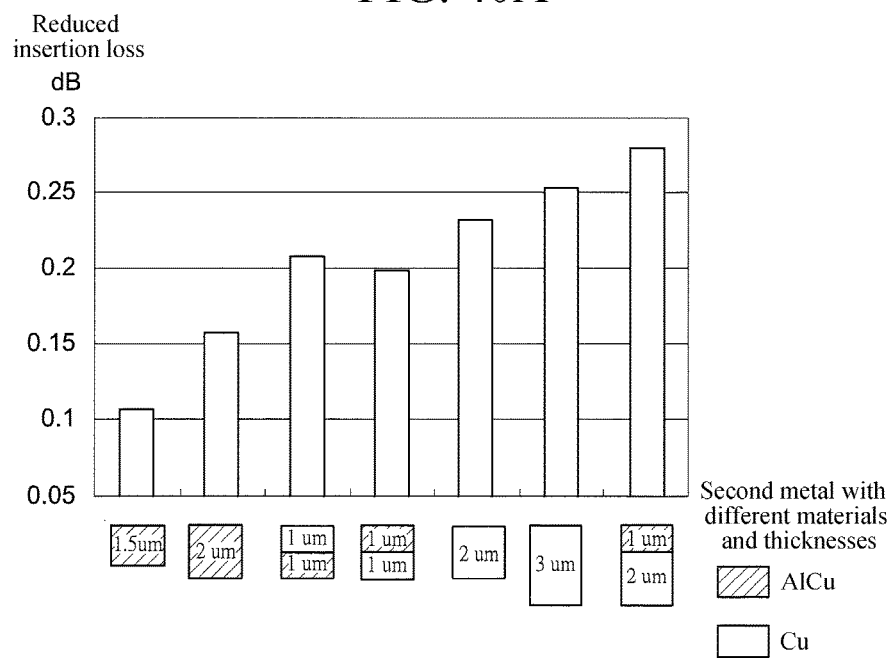
FIG. 40B illustrates a reduced insertion loss of a semiconductor device in another embodiment of the present disclosure.

FIG. 40B illustrates values of insertion loss decrease of a semiconductor device (e.g., semiconductor device 1, 2, 2a or 3) according to the present disclosure, in another embodiment in which the semiconductor device includes a third metal layer 13. Values of insertion loss are shown for different materials and thicknesses of the third metal layer 13, for operation of the semiconductor device at a frequency of 5.5 GHz. For example, for the third metal layer 13 with a 1 µm thick AlCu layer and a 2 µm thick copper layer, the semiconductor device has a relatively small insertion loss at an operating frequency of 5.5 GHz: insertion loss is decreased by 0.28 dB-0.29 dB.

Figure 41:
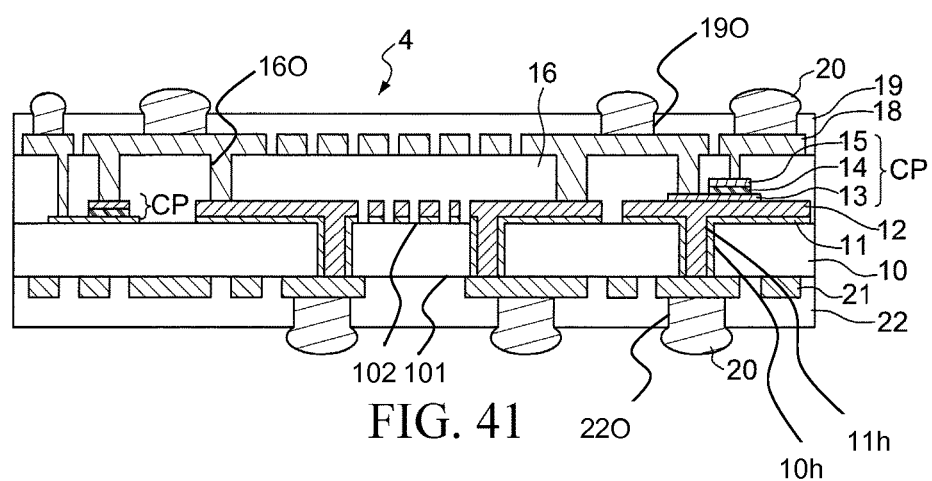
FIG. 41 is a diagram of a semiconductor device according to another embodiment of the present disclosure.

FIG. 41 is a diagram of a semiconductor device according to another embodiment of the present disclosure. A semiconductor device 4 includes a substrate 10, a seed layer 11, a first patterned metal layer 12, a first dielectric layer 14, a second metal layer 15, a third metal layer 13, a first passivation layer 16, a fifth patterned metal layer 18, a second passivation layer 19, a sixth patterned metal layer 21, a third passivation layer 22 and electrical connection components 20.

The substrate 10 has a first surface 101, a second surface 102 opposite the first surface 101, and first holes 10h extending through the substrate 10. The seed layer 11 is formed on the first surface 101 and on sidewalls of the first holes 10h. The seed layer 11 forms a second hole 11h in each of the first holes 10h. The first patterned metal layer 12 is formed on the seed layer 11 and in the second hole 11h.

The third metal layer 13, the first dielectric layer 14 and the second metal layer 15 may be, as illustrated in FIG. 41, formed on the first patterned metal layer 12 and the first surface 101. The third metal layer 13, the first dielectric layer 14 and the second metal layer 15 may form a capacitor CP, where the second metal layer 15 may serve as an upper electrode of the capacitor CP, and the third metal layer 13 may serve as a lower electrode of the capacitor CP.

The first passivation layer 16 is formed on the first surface 101, and covers the first surface 101, the seed layer 11, the first patterned metal layer 12 and the capacitor CP. The first passivation layer 16 defines a plurality of openings 16O.

The fifth patterned metal layer 18 is formed above the first passivation layer 16 and in the openings 16O. A portion of the fifth patterned metal layer 18 is electrically connected to a portion of the first patterned metal layer 12. A portion of the fifth patterned metal layer 18 is electrically connected to the second metal layer 15 and the lower electrode of capacitor CP.

The second passivation layer 19 is formed on the first passivation layer 16 and covers the fifth patterned metal layer 18. The second passivation layer 19 defines a plurality of openings 19O to expose part of the fifth patterned metal layer 18. The electrical connection components 20 are formed in the openings 19O.

The sixth patterned metal layer 21 is formed on the second surface 102, and is electrically connected to the first patterned metal layer 12. As can be seen in FIG. 41, the first patterned metal layer 12 extends from the first surface 101 of the substrate 10 to the second surface 102 via the second holes 11h, providing relatively good electrical conductivity between portions of the semiconductor device 4. For example, the structure provides relatively good electrical connection between the fifth patterned metal layer 18 and the sixth patterned metal layer 21. By way of comparison, if a conductivity of a material of the first patterned metal layer 12 is much greater than a conductivity of a material of the seed layer 11, the structure shown in FIG. 41 (the first patterned metal layer 12 directly connecting to the fifth patterned metal layer 18 and the sixth patterned metal layer 21) provides improved electrical connection over an implementation in which the seed layer 11 would be used between the first patterned metal layer 12 and one or both of the fifth patterned metal layer 18 and the sixth patterned metal layer 21.

The third passivation layer 22 is formed on the second surface 102 and covers the second surface 102 and the sixth patterned metal layer 21. The third passivation layer 22 defines openings 22O to expose portions of the sixth patterned metal layer 21. The electrical connection components 20 are formed in the openings 22O.

FIGS. 42-60 are diagrams of a process of making a semiconductor device according to another embodiment of the present disclosure.

Figure 42:
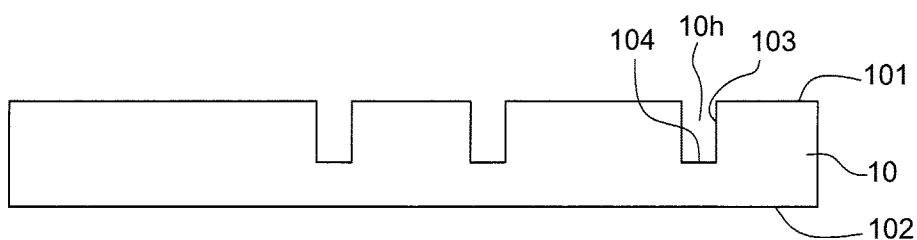
FIGS. 42, 43, 44, 45, 46, 46A, 47, 48, 49, 50, 51, 52, 53, 54, 55, 56, 57, 58, 59 and 60 are diagrams of a process of making a semiconductor device according to another embodiment of the present disclosure, where

Referring to FIG. 42, a substrate 10 is provided. Substrate 10 includes a plurality of first holes 10h. The substrate 10 has a first surface 101 and a second surface 102 that are opposite each other. The substrate 10 may be, or may include, but is not limited to, glass, silicon, silicon dioxide or other materials. The substrate 10 may have a thickness (e.g., a distance between the first surface 101 and the second surface 102) from about 50 μm to about 700 μm, such as about 50 μm to about 600 μm, about 50 μm to about 500 μm, about 50 μm to about 400 μm, about 50 μm to about 300 μm, about 50 μm to about 200 μm, or about 50 μm to about 100 μm.

The first holes 10h may have cylindrical, conical, or other shapes. The first holes 10h have sidewalls 103 and bottoms 104 (which may be a point, such as may be the case for a conical-shaped first hole 10h). For example, the cylindrical first holes 10h illustrated in FIG. 42 have sidewalls 103 substantially perpendicular to bottoms 104. The first holes 10h may be formed, for example, through laser, sandblasting and/or etching techniques, or other techniques, and the shape of the first holes 10h is defined during formation. For example, a laser technique may be used to form tapered sidewalls 103 of conical (or partially conical) first holes 10h. An opening of a first hole 10h at the first surface 101 may be in the shape of a circle, square or other shape. Openings of the first holes 10h on the first surface 101 may have a width from about 15 μm to about 70 μm (e.g., a radius from about 7.5 μm to about 35 μm for a circularly-shaped opening), such as about 15 μm to about 30 μm, about 15 μm to about 40 μm, about 15 μm to about 50 μm, or about 15 μm to about 60 μm. The first holes 10h may have a height (e.g., a vertical distance from the first surface 101 to the bottoms 104 of the first holes 10h) from about 50 μm to about 400 μm, such as about 50 μm to about 100 μm, about 50 μm to about 200 μm, or about 50 μm to about 300 μm.

Figure 43:
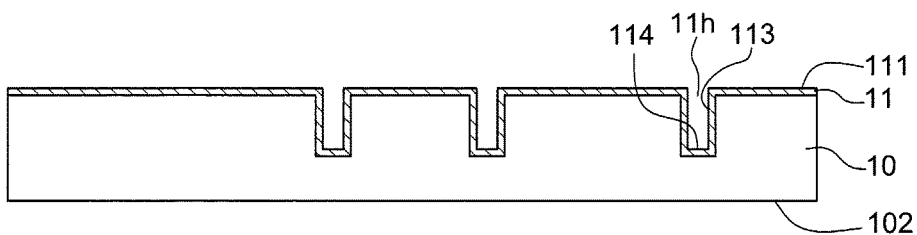

Referring to FIG. 43, in an embodiment of the present disclosure, a seed layer 11 is formed along the first surface 101 of the substrate 10, and along the sidewalls 103 and the bottoms 104 of the first holes 10h. The seed layer 11 may have a thickness from about 2600 Å to about 3400 Å, such as about 2600 Å to about 2800 Å, about 2600 Å to about 3000 Å, or about 2600 Å to about 3200 Å. The seed layer 11 formed along the sidewalls 103 and the bottoms 104 of the first holes 10h defines second holes 11h with sidewalls 113 and bottoms 114.

The seed layer 11 may be coated on the first surface 101 of the substrate 10, the sidewalls 103 and the bottoms 104 of the first holes 10h by using a sputter deposition technique or a PVD technique, or other technique. In another embodiment of the present disclosure, the seed layer 11 may be coated on the first surface 101 of the substrate 10, the sidewalls 103 and the bottoms 104 of the first holes 10h by using a CVD technique, an ALD technique or an evaporation technique.

The shape of the second holes 11h may be similar to that of the first holes 10h, but the size of the second holes 11h is less than a size of the first holes 10h. The second holes 11h may have a height (e.g., a vertical distance from an upper surface 111 of the seed layer 11 to the bottoms 114 of the second holes 11h) from about 50 μm to about 400 μm, such as about 50 μm to about 100 μm, about 50 μm to about 200 μm, or about 50 μm to about 300 μm. Openings of the second holes 11h on the upper surface 111 may have a width from 15 μm to 70 μm (e.g., a radius from about 7.5 μm to about 35 μm for a circularly-shaped opening), such as about 15 μm to about 30 μm, about 15 μm to about 40 μm, about 15 μm to about 50 μm, or about 15 μm to about 60 μm.

The seed layer 11 may be, or may include, but is not limited to, titanium or copper or an alloy thereof. For example, the seed layer 11 may include a titanium layer with a thickness from about 800 Å to about 1200 Å and a copper layer with a thickness from about 1800 Å to about 2200 Å, where the titanium layer has a sheet resistance that is approximately 7.22 Ohms, and the copper layer has sheet resistance that is approximately 0.14 Ohms.

Figure 44:
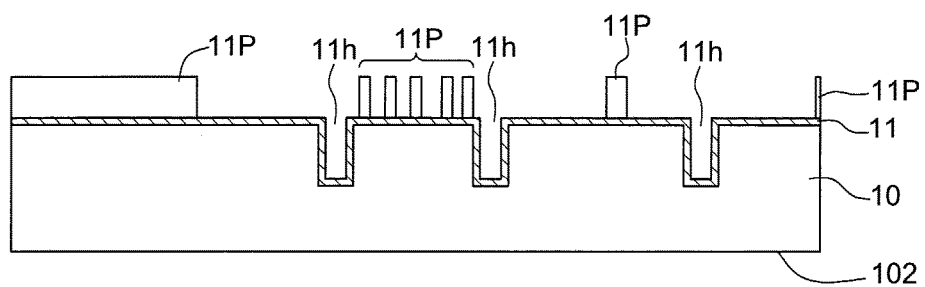

Referring to FIG. 44, a mask 11P is formed on the seed layer 11. The mask 11P may be, or may include, but is not limited to, a photoresist layer or a dry-resist film. The mask 11P may be formed, for example, in a pressing or laminating manner. The mask 11P may be a patterned mask 11P formed on the seed layer 11 and exposing the second holes 11h.

Figure 45:
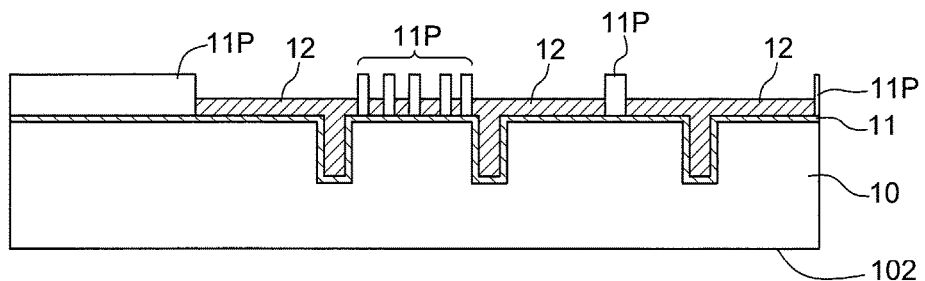

Referring to FIG. 45, a first patterned metal layer 12 is formed on the seed layer 11 and in the second holes 11h that are not covered by the mask 11P; for example, by an electroplating technique or other technique. The first patterned metal layer 12 may be, or may include, but is not limited to, copper or other metal, or a metal alloy.

Figure 46:
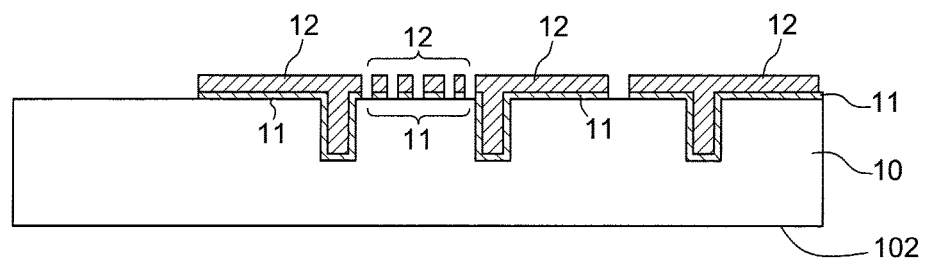

Referring to FIG. 46, the mask 11P is removed; for example, by a stripping technique or other technique. Further, a portion of the seed layer 11 not covered by the first patterned metal layer 12 is removed by, for example, an etching technique or other technique.

Figure 46A:
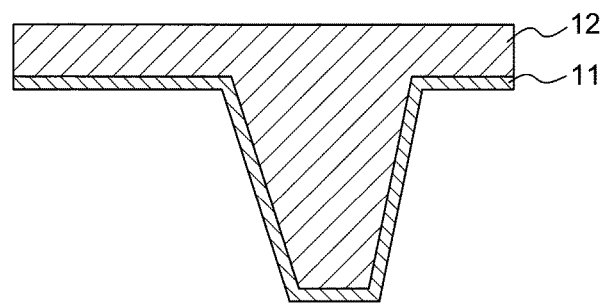

Referring to FIG. 46A, an enlarged view of the seed layer 11 and the first patterned metal layer 12 in FIG. 46 is shown, according to an embodiment of the disclosure. The first patterned metal layer 12 is formed on the seed layer 11 and formed in the second holes 11h. In an embodiment, a titanium layer included in the seed layer 11 has a sheet resistance that is approximately 7.22 Ohms, which is much greater than a sheet resistance (approximately 0.14 Ohm) of a copper layer such as may be used to form the first patterned metal layer 12. As the seed layer 11 is not present at openings of the second holes 11h on the first surface 101 of the substrate 10, electrical conductivity of the semiconductor device 4 may be improved.

Characteristics of the structure shown in FIG. 46A may be better understood by comparing the structures in FIG. 32 and FIG. 41.

Referring to FIG. 32, the first patterned metal layer 12 of the semiconductor device 3 may be connected to other circuit components (not shown) through the fourth metal layer 17, the fifth patterned metal layer 18 and the electrical connection components 20.

Referring to FIG. 41, the first patterned metal layer 12 of the semiconductor device 4 may be connected to other circuit components (not shown) through the fifth patterned metal layer 18 and the electrical connection components 20. In other words, the first patterned metal layer 12 is directly connected to the fifth patterned metal layer 18 (and the sixth patterned metal layer 21) rather than indirectly connected through the fourth metal layer 17. As the semiconductor device 4 of FIG. 41 has the structure shown in FIG. 46A, the electrical conductivity thereof is relatively better than that with an indirect correction.

Figure 47:
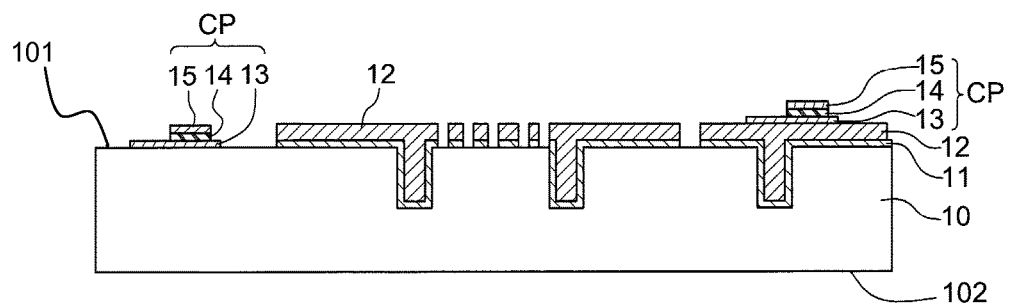

Referring to FIG. 47, capacitors CP are formed on the first patterned metal layer 12 or on the third metal layer 13. In some embodiments, a capacitor CP may be formed directly on the first surface 101 of the substrate 10. The third metal layer 13 is formed on the first surface 101 of the substrate 10 and on the first patterned metal layer 12 by, for example, a sputter deposition process or other technique. The third metal layer 13 may be, or may include, but is not limited to, aluminum or copper or an alloy thereof, or other metal or alloy. The third metal layer 13 may have a thickness from about 1 μm to about 16 μm, such as about 1 μm to about 8 μm, about 1 μm to about 10 μm, about 1 μm to about 12 μm, or about 1 μm to about 14 μm.

A first dielectric layer 14 is formed on the third metal layer 13. The first dielectric layer 14 may be formed on the third metal layer 13 by, for example, a sputter deposition process or other technique. In some embodiments, the first dielectric layer 14 is formed by forming a thin layer of a material on the third metal layer 13. The thin layer material may be, or may include, but is not limited to, Ta. For the example of Ta, the thin layer is oxidized to $Ta_2O_5$ using an anodic oxidation technique so as to form the first dielectric layer 14 containing $Ta_2O_5$. The first dielectric layer 14 may have a thickness from about 300 Å to about 4900 Å, such as about 300 Å to about 1000 Å, about 300 Å to about 2000 Å, about 300 Å to about 3000 Å, about 300 Å to about 4000 Å, or about 300 Å to about 4500 Å.

A second metal layer 15 is formed on the first dielectric layer 14. The second metal layer 15 may be formed, for example, by a sputter deposition process or other technique. The second metal layer 15 may be, or may include, but is not limited to, aluminum or copper or an alloy thereof, or other metal or alloy. The second metal layer 15 may have a thickness from about 0.25 μm to about 1.1 μm, such as about 0.25 μm to about 0.5 μm, about 0.25 μm to about 0.7 μm, or about 0.25 μm to about 0.9 μm. It can be seen from FIG. 47 that an area of the third metal layer 13 may be equal to or greater than an area of the second metal layer 15.

Figure 48:
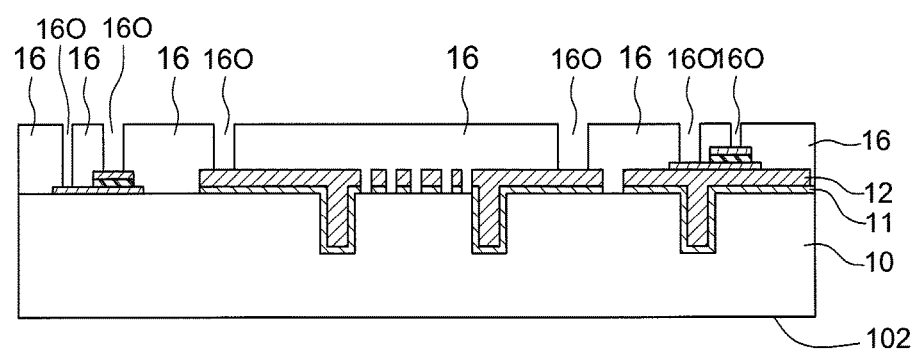

Referring to FIG. 48, a first passivation layer 16 is formed on the first surface 101 of the substrate 10; by, for example, a coating technique or other technique. The first passivation layer 16 covers the first surface 101, the seed layer 11, the first patterned metal layer 12 and the capacitors CP.

A plurality of openings 16O are formed in the first passivation layer 16 to expose portions of the first patterned metal layer 12, the second metal layer 15 and the third metal layer 13. The first passivation layer 16 may be, or may include, but is not limited to, polyimide, TMMR or BCB.

Figure 49:
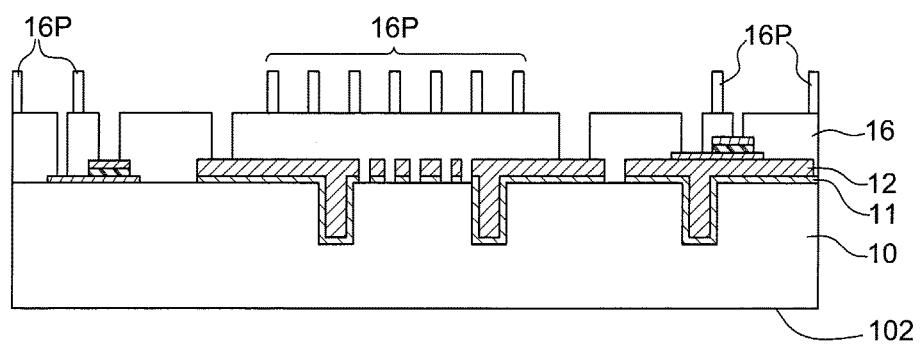

Referring to FIG. 49, a mask 16P is formed on the first passivation layer 16. The mask 16P may be, or may include, but is not limited to, a photoresist layer or a dry-resist film. The mask 16P may be formed, for example, in a pressing or laminating manner. The mask 16P may be a patterned mask 16P formed on the first passivation layer 16 but not covering the openings 16O.

Figure 50:
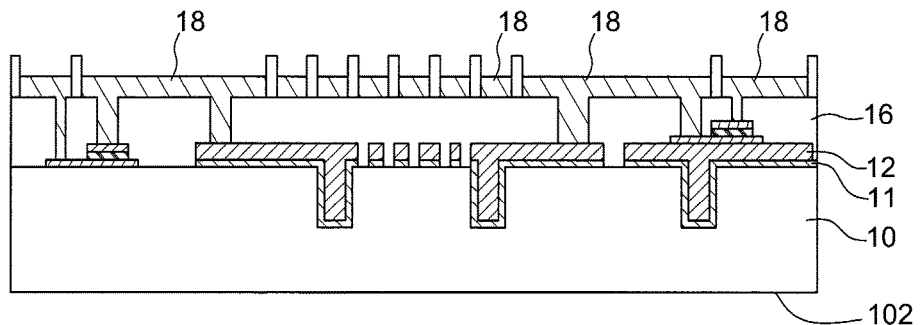

Referring to FIG. 50, a fifth patterned metal layer 18 is formed on the first passivation layer 16 and in the openings 16O that are not covered by the mask 16P. The fifth patterned metal layer 18 may be formed, for example, by an electroplating technique or other technique. The fifth patterned metal layer 18 may be, or may include, but is not limited to, copper or other metal, or an alloy. Portions of the fifth patterned metal layer 18 are electrically connected to or in contact with the first patterned metal layer 12, the second metal layer 15 and/or the third metal layer 13.

Figure 51:
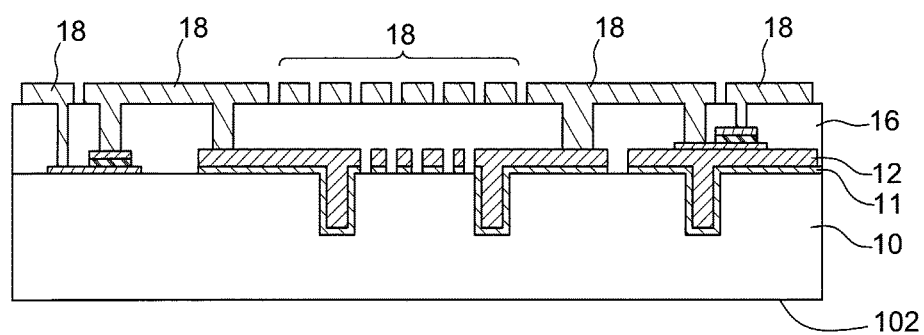

Referring to FIG. 51, the mask 16P in FIG. 50 is removed; for example, by a stripping technique or other technique.

Figure 52:
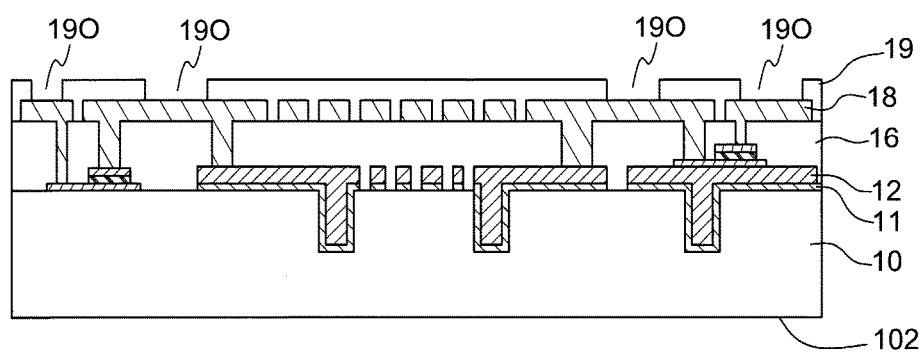

Referring to FIG. 52, a second passivation layer 19 is formed on the first passivation layer 16; for example by a coating technique or other technique. Openings 19O are formed in the second passivation layer 19 to expose portions of the fifth patterned metal layer 18. The second passivation layer 19 may be, or may include, but is not limited to, polyimide, TMMR or BCB.

Figure 53:
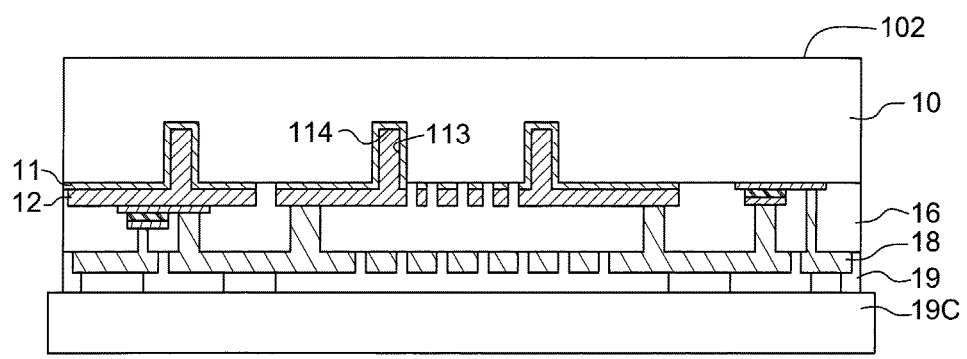

Referring to FIG. 53, the second passivation layer 19 is adhered to a carrier 19C, such as by a temporary adhesive.

Figure 54:
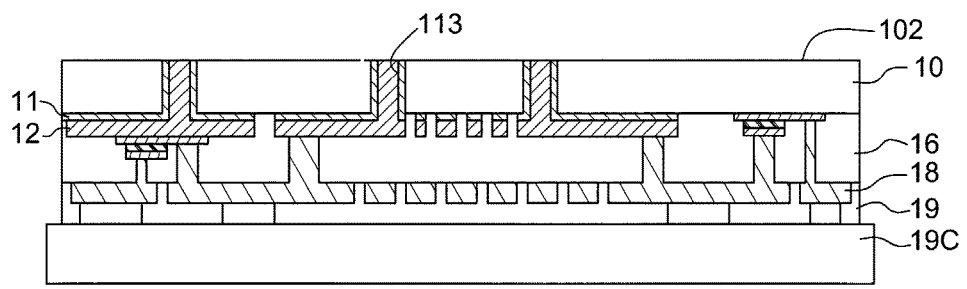

Referring to FIG. 54, the substrate 10 may be thinned; for example by a grinding or chemical mechanical polishing/planarization technique or other technique. A bottom 114 of the seed layer 11 is removed, leaving a second surface 102, and exposing sidewalls 113 of the seed layer 11, and sidewalls of the first patterned metal layer 12.

Figure 55:
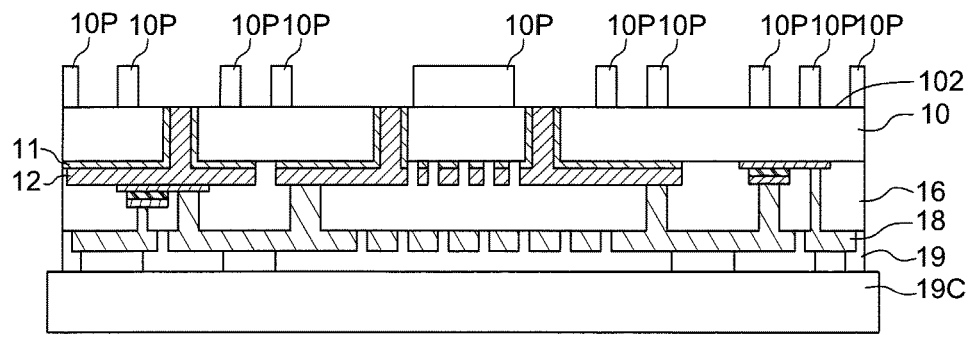

Referring to FIG. 55, a mask 10P is formed on the second surface 102 of the substrate 10. The mask 10P may be, or may include, but is not limited to, a photoresist layer or a dry-resist film. The mask 10P may be formed, for example, in a pressing or laminating manner. The mask 10P may be a patterned mask 10P formed on the second surface 102 but exposing the seed layer 11 and the first patterned metal layer 12.

Figure 56:
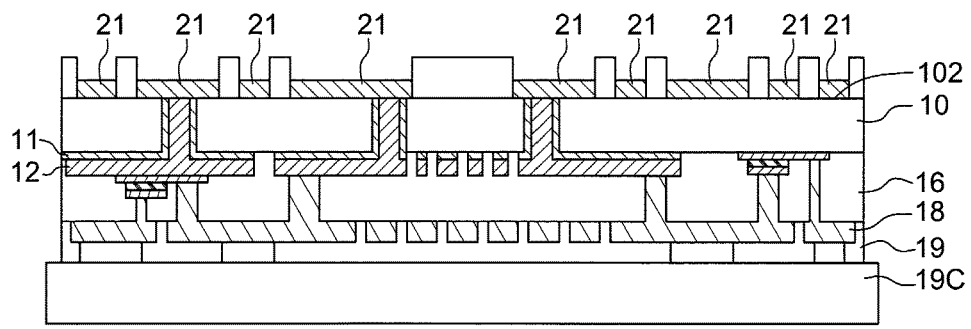

Referring to FIG. 56, a sixth patterned metal layer 21 is formed on the second surface 102 not covered by the mask 10P. The sixth patterned metal layer 21 may be formed, for example, by an electroplating technique or other technique. The sixth patterned metal layer 21 may be, or may include, but is not limited to, copper or other metal, or an alloy. Portions of the sixth patterned metal layer 21 are electrically connected to or in contact with the first patterned metal layer 12 and the seed layer 11.

Figure 57:
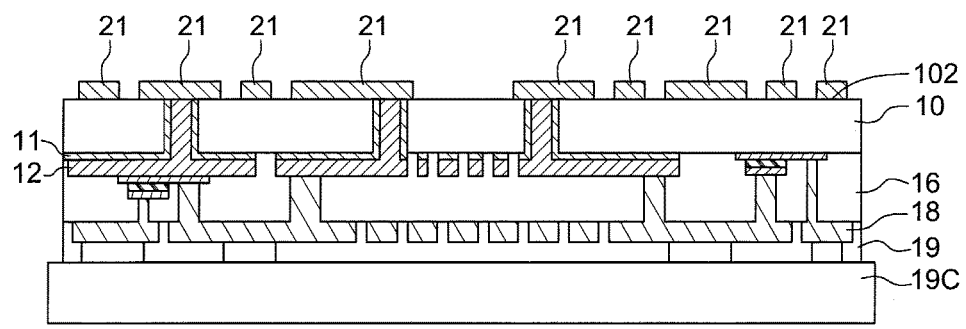

Referring to FIG. 57, the mask 10P is removed; for example by a stripping technique or other technique.

Figure 58:
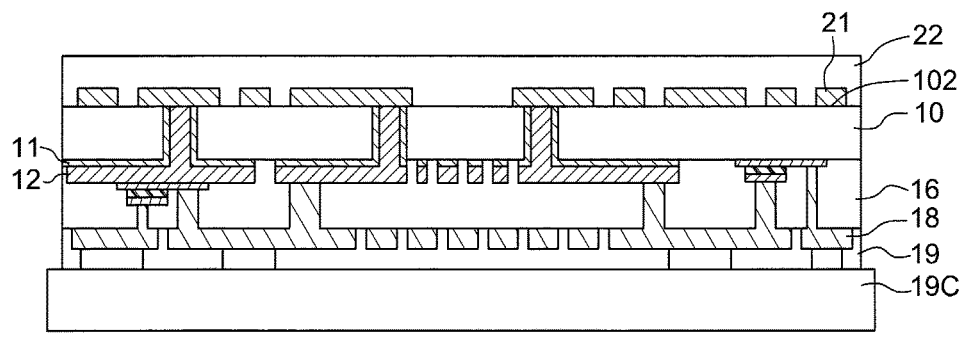

Referring to FIG. 58, a third passivation layer 22 is formed on the second surface 102 to cover the second surface 102 and the sixth patterned metal layer 21; for example, by a coating technique. The third passivation layer 22 may be, or may include, but is not limited to, polyimide, TMMR or BCB.

Figure 59:
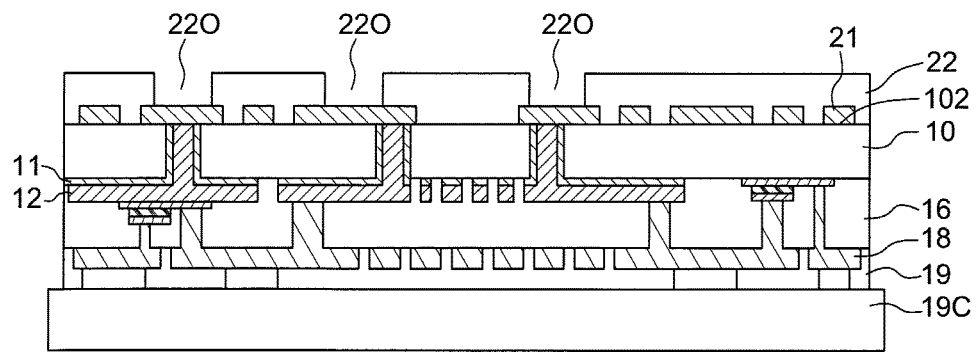

Referring to FIG. 59, in an embodiment of the present disclosure, openings 22O are formed in the third passivation layer 22 to expose part of the sixth patterned metal layer 21.

Figure 60:
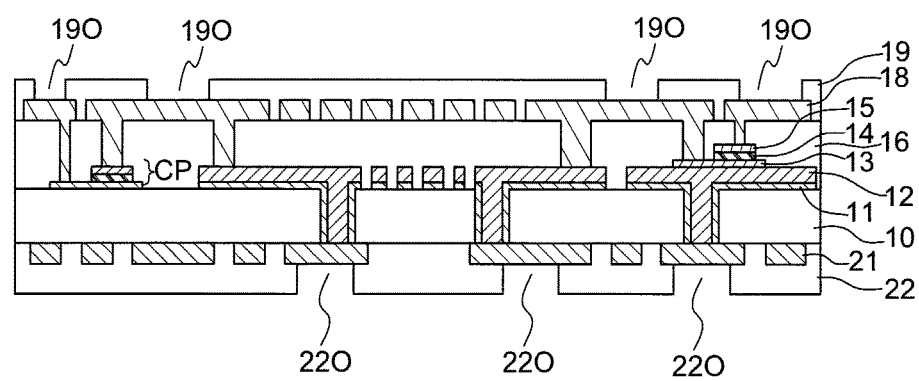

Referring to FIG. 60, the carrier 19C is removed, such as mechanically or manually removed. Electrical connection components 20 may be formed in openings 19O and/or openings 22O, such as by way of solder bumping or solder implanting. The electrical connection components 20 may be, or may include, but are not limited to, solder.

Figure 61:
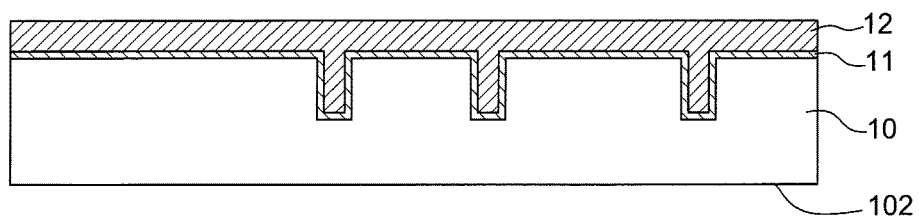
FIGS. 61 and 62 are diagrams of a process of making a semiconductor device according to another embodiment of the present disclosure.
Figure 62:
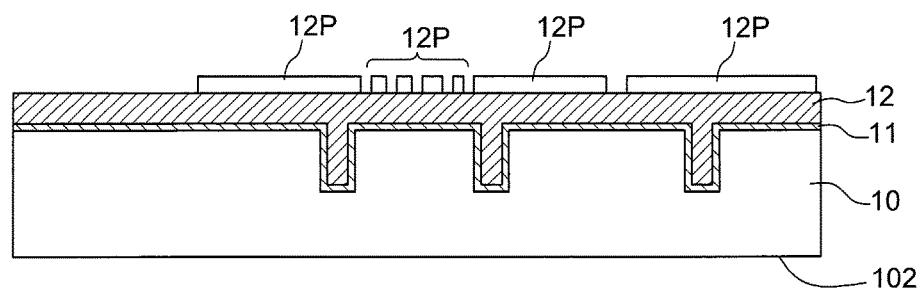

FIGS. 61-62 are diagrams of a process of making a semiconductor device according to another embodiment of the present disclosure. Referring to FIG. 61, after the seed layer 11 shown in FIG. 43 is formed, rather than using a mask 11P (as shown in FIG. 44), a first patterned metal layer 12 is formed on the seed layer 11 and in the second holes 11h; for example, by an electroplating process. The first patterned metal layer 12 may be, or may include, but is not limited to, copper or other metal, or an alloy.

Referring to FIG. 62, a mask 12P is formed on the first patterned metal layer 12. The mask 12P may be, or may include, but is not limited to, a photoresist layer or a dry-resist film. The mask 12P may be formed, for example, in a pressing or laminating manner. The mask 12P may be a patterned mask 12P. The first patterned metal layer 12 not covered by the mask 12P may be removed; for example, by an etching technique. The mask 12P may be removed to form the structure shown in FIG. 46; for example, by a stripping technique or other technique.

As used herein and not otherwise defined, the terms "approximately," "substantially" and "about" are used to describe and account for small variations. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
a substrate including a first surface;
a seed layer disposed on the first surface;
a first patterned metal layer disposed on the seed layer, the first patterned metal layer having a first thickness, and the first patterned metal layer including a first part and a second part;
a first dielectric layer disposed on the first part of the first patterned metal layer;
a second metal layer disposed on the first dielectric layer and having a second thickness, wherein the first thickness is greater than the second thickness; and
a third metal layer, wherein the third metal layer is disposed on the first part of the first patterned metal layer or disposed between the first part of the first patterned metal layer and the first dielectric layer, and the third metal layer has a third thickness, wherein the third thickness is greater than the second thickness;
wherein the first part of the first patterned metal layer, the first dielectric layer and the second metal layer form a capacitor, and
wherein the first part of the first patterned metal layer is a lower electrode of the capacitor, and the second part of the first patterned metal layer is an inductor.

2. The semiconductor device according to claim 1, wherein an area of the third metal layer is greater than or equal to an area of the second metal layer.

3. The semiconductor device according to claim 1, wherein an area of the first patterned metal layer is greater than or equal to an area of the third metal layer.

4. The semiconductor device according to claim 1, further comprising a first passivation layer, wherein the first passivation layer is disposed on the first surface and covers the seed layer, the first patterned metal layer, the first dielectric layer, the second metal layer and the third metal layer, wherein the first passivation layer defines at least one opening to expose a portion of the second metal layer.

5. The semiconductor device according to claim 4, wherein the opening of the first passivation layer further exposes the third metal layer or the first patterned metal layer.

6. The semiconductor device according to claim 5, further comprising a fourth metal layer, wherein the fourth metal layer is disposed on the first passivation layer, and is further disposed on portions of the first patterned metal layer and the second metal layer that are exposed by the opening of the first passivation layer.

7. The semiconductor device according to claim 5, further comprising a second seed layer, wherein the second seed layer is disposed on the first passivation layer, and is further disposed on portions of the first patterned metal layer and the second metal layer that are exposed by the opening of the first passivation layer.

8. The semiconductor device according to claim 7, further comprising a fourth patterned metal layer, wherein the fourth patterned metal layer is disposed on the second seed layer.

9. The semiconductor device according to claim 8, further comprising a second passivation layer disposed on the second seed layer and the fourth patterned metal layer, the second passivation layer defining at least one opening to expose a portion of the fourth patterned metal layer.

10. The semiconductor device according to claim 9, further comprising at least one electrical connection element disposed on the exposed portion of the fourth patterned metal layer.

11. A process of making a semiconductor device, comprising:
- (a) providing a substrate having a first surface;
- (b) providing a seed layer on the first surface of the substrate;
- (c) forming a first patterned metal layer on the seed layer, wherein the first patterned metal layer has a first thickness, and the first patterned metal layer includes a first part and a second part;
- (d) forming a second metal layer on the first part of the first patterned metal layer, wherein the second metal layer has a second thickness;
- (e) forming a first dielectric layer over the first part of the first patterned metal layer and a portion of the second metal layer; and
- (f) forming a third metal layer on the first dielectric layer, the third metal layer having a third thickness, wherein each of the first thickness and the second thickness is greater than the third thickness, wherein the first part of the first patterned metal layer, the first dielectric layer and the third metal layer form a capacitor, and wherein the first part of the first patterned metal layer is a lower electrode of the capacitor and the second part of the first patterned metal layer is an inductor.

12. The process of making a semiconductor device according to claim 11, wherein, after (c), the process further comprises: removing, by using the first patterned metal layer as a mask, a portion of the seed layer not covered by the first patterned metal layer.

13. The process of making a semiconductor device according to claim 11, wherein, after (f), the process further comprises (g) forming a first passivation layer on the first surface, wherein the first passivation layer covers the seed layer, the first patterned metal layer, the first dielectric layer, the second metal layer and the third metal layer, and wherein the first passivation layer defines at least one opening to expose the third metal layer.

14. The process of making a semiconductor device according to claim 13, wherein the opening of the first passivation layer further exposes the second metal layer or the first patterned metal layer.

15. The process of making a semiconductor device according to claim 14, wherein, after (g), the process further comprises: (h) forming a fourth metal layer on the first passivation layer, wherein the fourth metal layer is formed on the exposed first patterned metal layer and the exposed third metal layer through the opening of the first passivation layer.

16. The process of making a semiconductor device according to claim 14, wherein, after (g), the process further comprises: (h) forming a second seed layer on the first passivation layer, wherein the second seed layer is formed on the exposed first patterned metal layer and the exposed third metal layer through the opening of the first passivation layer.

17. A semiconductor device, comprising:
- a substrate having a first surface and a second surface opposite the first surface, the substrate defining a plurality of first holes penetrating the substrate;
- a seed layer disposed on the first surface and on sidewalls of the first holes, wherein the seed layer defines a second hole within each of the plurality of first holes;
- a first patterned metal layer disposed on the seed layer and in the second holes, wherein the first patterned metal layer has a first thickness, and wherein the first patterned metal layer includes a first part and a second part;
- a first dielectric layer disposed on the first part of the first patterned metal layer;
- a second metal layer disposed on the first dielectric layer and having a second thickness, wherein the first thickness is greater than the second thickness; and
- a third metal layer, wherein the third metal layer is disposed on the first part of the first patterned metal layer or disposed between the first part of the first patterned metal layer and the first dielectric layer, and the third metal layer has a third thickness, wherein the third thickness is greater than the second thickness;
- wherein the first part of the first patterned metal layer, the first dielectric layer and the second metal layer form a capacitor, and wherein the first part of the first patterned metal layer is a lower electrode of the capacitor and the second part of the first patterned metal layer is an inductor.

* * * * *